United States Patent
Chen et al.

(10) Patent No.: US 11,181,702 B2
(45) Date of Patent: Nov. 23, 2021

(54) PLANAR OPTICAL WAVEGUIDE STRUCTURE, AND COUPLING STRUCTURE THEREOF AND COUPLING METHOD THEREOF

(71) Applicant: Wuhan Telecommunication Devices Co., Ltd., Hubei (CN)

(72) Inventors: Ben Chen, Hubei (CN); Xuerui Liang, Hubei (CN); Baiquan Hu, Hubei (CN); Chenggang Liu, Hubei (CN); Di Zhang, Hubei (CN); Yongan Fu, Hubei (CN); Liping Sun, Hubei (CN); Weidong Ma, Hubei (CN); Xianghong Yu, Hubei (CN)

(73) Assignee: Wuhan Telecommunication Devices Co., Ltd., Wuhan (CN)

(*) Notice: Subject to any disclaimer, the term of this patent is extended or adjusted under 35 U.S.C. 154(b) by 0 days.

(21) Appl. No.: 16/843,882

(22) Filed: Apr. 9, 2020

(65) Prior Publication Data
US 2020/0233159 A1 Jul. 23, 2020

Related U.S. Application Data

(60) Division of application No. 16/192,845, filed on Nov. 16, 2018, now Pat. No. 10,656,350, which is a continuation of application No. PCT/CN2016/110358, filed on Dec. 16, 2016.

(30) Foreign Application Priority Data

May 17, 2016 (CN) .......................... 201610326163.8
May 17, 2016 (CN) .......................... 201610326883.4
May 17, 2016 (CN) .......................... 201610327114.6

(51) Int. Cl.
*G02B 6/42* (2006.01)
*G02B 6/122* (2006.01)

(52) U.S. Cl.
CPC ......... *G02B 6/4212* (2013.01); *G02B 6/1228* (2013.01); *G02B 6/42* (2013.01); *H01L 2224/16225* (2013.01)

(58) Field of Classification Search
CPC ....... G02B 6/4212; G02B 6/1228; G02B 6/42
See application file for complete search history.

(56) References Cited

U.S. PATENT DOCUMENTS

| | | | |
|---|---|---|---|
| 9,435,946 B2* | 9/2016 | Sakakibara | G02B 6/12002 |
| 9,651,739 B2* | 5/2017 | Webster | G02B 6/1228 |
| 9,746,607 B2* | 8/2017 | Collins | G02B 6/12002 |
| 2007/0171515 A1* | 7/2007 | Kang | H01S 5/026 |
| | | | 359/333 |

(Continued)

*Primary Examiner* — Ellen E Kim

(57) ABSTRACT

A coupling structure includes a single mode active device and a planar optical waveguide. Specifically, the planar optical waveguide includes a silica waveguide for transmitting an optical signal, where the silica waveguide includes a coupling section and a conduction section; the coupling section is of a regular trapezoidal structure or an inverted trapezoidal structure, where a surface of the coupling section coupled to the single mode active device is a trapezoid top, and a surface of the coupling section connected with the conduction section is a trapezoid bottom; and a coupling gap is preset between the single mode active device and the planar optical waveguide.

2 Claims, 15 Drawing Sheets

(56) References Cited

U.S. PATENT DOCUMENTS

2012/0230635 A1\* 9/2012 Yoshida ................. G02B 6/125
                                                        385/43
2015/0010266 A1\* 1/2015 Webster ............... G02B 6/1228
                                                        385/14
2015/0247974 A1\* 9/2015 Painchaud ............... G02B 6/14
                                                        385/14

\* cited by examiner

PLANAR OPTICAL WAVEGUIDE STRUCTURE, AND COUPLING STRUCTURE THEREOF AND COUPLING METHOD THEREOF

CROSS REFERENCE TO RELATED APPLICATIONS

This application is a divisional application of U.S. patent application Ser. No. 16/192,845, filed on Nov. 16, 2018, which is a continuation of International Patent Application No. PCT/CN2016/110358, filed on Dec. 16, 2016, which claims the benefit of Chinese Patent Application Nos. 201610326883.4, 201610327114.6, and 201610326163.8, filed on May 17, 2016. The afore-mentioned patent applications are hereby incorporated by reference in their entireties.

TECHNICAL FIELD

The present disclosure relates to the technical field of optical waveguide coupling, and in particular, to a planar optical waveguide structure, and a coupling structure thereof and a coupling method thereof.

BACKGROUND

At present, mainstream 40G/100G optical modules are basically implemented through free-space coupling technologies based on prisms, lenses, optical filters, and the like, and are characterized in a complicated process, a need for active alignment, high packaging costs, and a great difficulty in larger-scale integration.

On the other hand, a photonic integration technology generally means that active devices (lasers, detectors, optical amplifiers, optical modulators, and the like) and passive devices (optical splitters/combiners, optical filters, optical multiplexers/demultiplexers, and the like) are integrated to implement a monolithic multi-functional optical device technology. The photonic integration technology is considered as a powerful optical module technology in the near future and especially in short-range optical interconnect applications such as data centers. However, how to effectively couple light of a single mode laser to a planar optical waveguide (also known as Planar Lightwave Circuit, PLC) or other silicon-based optical integrated chips is still a big issue at present. In addition to the coupling efficiency, how to make the process simple and practicable and use automatic devices to achieve the effect of reducing costs is also an important issue.

SUMMARY

The technical problem to be solved by embodiments of the present disclosure is how to effectively couple light of a single mode laser to a planar optical waveguide or other silicon-based optical integrated chips.

A further technical problem to be solved by the embodiments of the present disclosure is how to provide a planar optical waveguide structure and a corresponding coupling structure and coupling method for single-core, multi-core, and hybrid multi-core application scenarios separately.

The embodiments of the present disclosure apply the following technical solutions:

In a first aspect, an embodiment of the present disclosure provides a coupling structure based on a planar optical waveguide, where the coupling structure includes a single mode active device and a planar optical waveguide, specifically:

the planar optical waveguide includes a silica waveguide for transmitting an optical signal, where the silica waveguide includes a coupling section and a conduction section;

the coupling section is of a regular trapezoidal structure or an inverted trapezoidal structure, where a surface of the coupling section coupled to the single mode active device is a trapezoid top, and a surface of the coupling section connected with the conduction section is a trapezoid bottom;

a coupling gap is preset between the single mode active device and the planar optical waveguide.

Alternatively, the coupling gap d has a value of 5 µm to 50 µm, and the coupling gap is filled with a matching gel for refractive index matching.

Alternatively, when the single mode active device is specifically a Gaussian single mode semiconductor laser having a center wavelength of 1310 nm to 1660 nm and a far-field emission angle of 10° to 40° in the X direction and 10° to 45° in the Y direction, a trapezoid top surface width W1 of the coupling section=2.6 µm, and a trapezoid top surface height H1=4.4 µm; a trapezoid bottom surface width W2=3.3 µm, and a trapezoid bottom surface height H2=4.4 µm; and a trapezoid length L=800 µm.

Alternatively, when the single mode active device has a light-emitting surface refractive index of 1.48, the matching gel has a refractive index of 1.48.

Alternatively, the coupling structure including the single mode active device and the planar optical waveguide specifically includes an Ethernet passive optical network (EPON) optical module, a gigabit passive optical network (GPON) optical module, high-speed single-channel optical modules SFP and SFP+ in data communication, or parallel modules QSFP and QSFP28 for 40G and 100G optical transmission.

In a second aspect, an embodiment of the present disclosure further provides a planar optical waveguide structure, where the planar optical waveguide structure includes a silica waveguide for transmitting an optical signal, specifically:

the silica waveguide includes a coupling section and a conduction section;

the coupling section is of a regular trapezoidal structure or an inverted trapezoidal structure, where a surface of the coupling section for being coupled to the single mode active device is a trapezoid top, and a surface of the coupling section connected with the conduction section is a trapezoid bottom.

Alternatively, a trapezoid top surface width W1 of the coupling section=2.6 µm, and a trapezoid top surface height H1=4.4 µm; a trapezoid bottom surface width W2=3.3 µm, and a trapezoid bottom surface height H2=4.4 µm; and a trapezoid length L=800 µm.

Alternatively, a single mode active device mounting base is disposed on the planar optical waveguide, and a bonding pad and an alignment mark are disposed on the base.

In a third aspect, an embodiment of the present disclosure further provides a coupling method based on a planar optical waveguide. A silica waveguide in a planar optical waveguide includes a coupling section and a conduction section, and the method includes:

generating the planar optical waveguide, where the coupling section is of a trapezoidal structure, where a trapezoid top surface width W1=2.6 µm, and a trapezoid top surface height H1=4.4 µm; a trapezoid bottom surface width W2=3.3 μm, and a trapezoid bottom surface height H2=4.4 μm; and a trapezoid length L=800 μm;

generating a single mode active device mounting base on the planar optical waveguide, and disposing a bonding pad and an alignment mark on the base;

confirming that a selected single mode active device is specifically a Gaussian single mode semiconductor laser having a center wavelength of 1310 nm to 1660 nm and a far-field emission angle of 10° to 40° in the X direction and 10° to 45° in the Y direction; and welding the semiconductor laser according to the alignment mark on the planar optical waveguide.

Alternatively, after the single mode active device and the planar optical waveguide are welded together, there is a preset coupling gap between the single mode active device and the planar optical waveguide, and the method further includes:

selecting a matching gel according to coating parameters of the laser and a refractive index of a silica waveguide, and filling the coupling gap with the selected matching gel.

In a fourth aspect, an embodiment of the present disclosure further provides a planar optical waveguide structure, where the planar optical waveguide internally includes a silica main waveguide for transmitting an optical signal, and an auxiliary waveguide for assisting light entering;

the auxiliary waveguide includes a silicon nitride auxiliary waveguide that is closely attached to the silica main waveguide.

Alternatively, the silicon nitride auxiliary waveguide includes two sub-auxiliary waveguides, where a first sub-auxiliary waveguide is located on an upper surface of the silica main waveguide, and a second sub-auxiliary waveguide is located on a lower surface of the silica main waveguide.

Alternatively, the first sub-auxiliary waveguide and the second sub-auxiliary waveguide each include a transition portion and a cone portion, where the transition portion is a rectangular cube extending in a direction of light transmission; and the cone portion is of a structure with a bottom surface connected with the transition portion and a cone top extending in the direction of light transmission.

Alternatively, the silicon nitride auxiliary waveguide includes three sub-auxiliary waveguides, where a first sub-auxiliary waveguide, a second sub-auxiliary waveguide and a third sub-auxiliary waveguide are located on an upper surface of the silica main waveguide; and the three sub-auxiliary waveguides are each of a cone structure, wherein a cone top extends in a direction of light transmission.

Alternatively, the three sub-auxiliary waveguides are spaced apart by a predetermined distance, and the three sub-auxiliary waveguides are arranged in parallel.

Alternatively, the auxiliary waveguide further includes a silica auxiliary waveguide, specifically:

the silicon nitride auxiliary waveguide and the silica auxiliary waveguide each include a transition portion and a cone portion, the transition portion is a rectangular cube extending in a direction of light transmission; the cone portion is of a structure with a bottom surface connected with the transition portion and a cone top extending in the direction of light transmission, where the silicon nitride auxiliary waveguide is located on the upper surface of the silica main waveguide, and the silica auxiliary waveguide is located on the upper surface of the silica main waveguide and covers the silicon nitride auxiliary waveguide.

In a fifth aspect, an embodiment of the present disclosure further provides a coupling structure based on a planar optical waveguide, where the coupling structure includes a planar optical waveguide with the structure described in the fourth aspect, and the coupling structure further includes a single mode active device, specifically:

the planar optical waveguide is provided with a single mode active device fixing platform located on a light-incident side of the silica main waveguide and the silicon nitride auxiliary waveguide;

a bonding pad and an alignment mark are disposed on the fixing platform, the bonding pad is configured to be welded to a corresponding bonding pad on the single mode active device; and the alignment mark is configured to provide addressing of a binding welding spot for an automatic binding machine;

in the coupling structure, a coupling gap d is disposed between the single mode active device and light inlets of the silica main waveguide and the silicon nitride auxiliary waveguide, and the coupling gap is filled with a matching gel for refractive index matching.

In a sixth aspect, an embodiment of the present disclosure further provides a coupling method based on a planar optical waveguide, including:

determining an optical wavelength and a far-field emission angle of a single mode active device;

selecting, according to the far-field emission angle, a planar optical waveguide adapted to the far-field emission angle;

welding the single mode active device according to a bonding pad and an alignment mark that are disposed on the planar optical waveguide; and filling a coupling gap between a light outlet of the single mode active device and a light inlet of the planar optical waveguide with a matching gel.

Alternatively, the planar optical waveguide includes a main waveguide and an auxiliary waveguide, and the selecting, according to the far-field emission angle, a planar optical waveguide adapted to the far-field emission angle specifically includes:

determining, according to the far-field emission angle, that the single mode active device is a transverse elliptical light source or a longitudinal elliptical light source;

if the single mode active device is the transverse elliptical light source, selecting a planar optical waveguide with an auxiliary waveguide embedded in a single-side tiling manner on a main waveguide; or if the single mode active device is the longitudinal elliptical light source, selecting a planar optical waveguide with an auxiliary waveguide embedded in a double-side tiling manner on a main waveguide.

Alternatively, the planar optical waveguide with the auxiliary waveguide embedded in a single-side tiling manner on the main waveguide is specifically implemented as follows:

a silicon nitride auxiliary waveguide includes three sub-auxiliary waveguides, where a first sub-auxiliary waveguide, a second sub-auxiliary waveguide and a third sub-auxiliary waveguide are located on an upper surface of a silica main waveguide; and the three sub-auxiliary waveguides are each of a cone structure, where a cone top extends in a direction of light transmission; or a silicon nitride auxiliary waveguide and a silica auxiliary waveguide each include a transition portion and a cone portion, and the transition portion is a rectangular cube extending in a direction of light transmission; the cone portion is of a structure with a bottom surface connected with the transition portion and a cone top extending in the direction of light transmission; where the silicon nitride auxiliary waveguide is located on an upper surface of a silica main waveguide, and the silica auxiliary waveguide is located on the upper surface of the silica main waveguide and covers the silicon nitride auxiliary waveguide;

the planar optical waveguide with the auxiliary waveguide embedded in a double-side tiling manner on the main waveguide is specifically implemented as follows:

a silicon nitride auxiliary waveguide includes two sub-auxiliary waveguides, where a first sub-auxiliary waveguide is located on an upper surface of a silica main waveguide, and a second sub-auxiliary waveguide is located on a lower surface of the silica main waveguide.

In a seventh aspect, an embodiment of the present disclosure further provides a planar optical waveguide structure, where the planar optical waveguide internally includes a silica main waveguide for transmitting an optical signal, and an auxiliary waveguide for assisting light entering;

the auxiliary waveguide includes one or more silica auxiliary waveguides that are disposed at a predetermined center distance from the silica main waveguide.

Alternatively, the auxiliary waveguide specifically includes two sub-auxiliary waveguides, where a first sub-auxiliary waveguide is located on an upper side of the silica main waveguide, and a second sub-auxiliary waveguide is located on a lower side of the silica main waveguide.

Alternatively, the first sub-auxiliary waveguide and the second sub-auxiliary waveguide each include a regular trapezoidal structure, where a trapezoid top and a light inlet of the silica main waveguide are located on a same side; a trapezoid bottom extends in a direction of light transmission, and a width of the trapezoid bottom is the same as a width of the silica main waveguide, where side faces of a first sub-auxiliary waveguide trapezoid and a second sub-auxiliary waveguide trapezoid adjacent to upper and lower planes of the silica main waveguide are kept parallel to the upper and lower planes of the silica main waveguide respectively.

Alternatively, when a selected single mode active device has a center wavelength of 1310 nm to 1660 nm and a far-field emission angle of 25°×40°, parameters of the main waveguide and the auxiliary waveguide are specifically as follows:

a width $W_{main}$ of the light inlet of the main waveguide=3.0 µm, and a height $H_{main}$=3.0 µm;

a width $W_{auxiliary\ in}$ of a light inlet of the auxiliary waveguide=2.6 µm, and a height $H_{auxiliary\ in}$=3.0 µm;

a width $W_{auxiliary\ out}$ of a trapezoid bottom of the auxiliary waveguide=3.0 µm, and a height $H_{auxiliary\ out}$=3.0 µm;

a length $L_{auxiliary}$ of the auxiliary waveguide=100 µm, and the center distance Ay between the main waveguide and the auxiliary waveguide=3.6 µm.

Alternatively, the main waveguide and the auxiliary waveguide are in a multi-core planar optical waveguide structure, and the inside and the outside of respective core layers of the main waveguide and the auxiliary waveguide are provided with cladding layers having similar refractive indexes; and a relative refractive index difference is 0.013.

Alternatively, the auxiliary waveguide specifically includes eight sub-auxiliary waveguides, where a first sub-auxiliary waveguide is located on an upper side of the silica main waveguide; a second sub-auxiliary waveguide is located on a lower side of the silica main waveguide; a third sub-auxiliary waveguide is located on a left side of the silica main waveguide; a fourth sub-auxiliary waveguide is located on a right side of the silica main waveguide; a fifth sub-auxiliary waveguide is located on an upper left side of the silica main waveguide, on a left side of the first sub-auxiliary waveguide, and on an upper side of the third sub-auxiliary waveguide; a sixth sub-auxiliary waveguide is located on an upper right side of the silica main waveguide, on the right side of the first sub-auxiliary waveguide, and on an upper side of the fourth sub-auxiliary waveguide; a seventh sub-auxiliary waveguide is located on a lower left side of the silica main waveguide, on a left side of the second sub-auxiliary waveguide, and on a lower side of the third sub-auxiliary waveguide; and an eighth sub-auxiliary waveguide is located on a lower right side of the silica main waveguide, on a right side of the second sub-auxiliary waveguide, and on a lower side of the fourth sub-auxiliary waveguide.

Alternatively, each sub-auxiliary waveguide is specifically of a regular trapezoidal structure, and four side faces connected with a trapezoid top and a trapezoid bottom are all inclined planes, where the trapezoid top and a light inlet of the silica main waveguide are located on a same side of a multi-core planar optical waveguide.

Alternatively, the main waveguide and the auxiliary waveguide are in the multi-core planar optical waveguide structure, and the inside and the outside of respective core layers of the main waveguide and the auxiliary waveguide are provided with cladding layers having similar refractive indexes; and a relative refractive index difference is 0.013.

In an eighth aspect, an embodiment of the present disclosure further provides a coupling structure based on a planar optical waveguide, where the coupling structure includes a planar optical waveguide with the structure described in the seventh aspect, and the coupling structure further includes a single mode active device, specifically:

a multi-core planar optical waveguide is provided with a single mode active device fixing platform located on a light-incident side of a silica main waveguide and a silica auxiliary waveguide;

a bonding pad and an alignment mark are disposed on the fixing platform, the bonding pad is configured to be welded to a corresponding bonding pad on the single mode active device; and the alignment mark is configured to provide addressing of a binding welding spot for an automatic binding machine;

in the coupling structure, a coupling gap d is formed between the single mode active device and light inlets of the silica main waveguide and the silica auxiliary waveguide, and the coupling gap is filled with a matching gel for refractive index matching.

Alternatively, the coupling structure including the single mode active device and the multi-core planar optical waveguide specifically includes an EPON optical module, a GPON optical module, high-speed single-channel optical modules SFP and SFP+ in data communication, or parallel modules QSFP and QSFP28 for 40G and 100G optical transmission.

DETAILED DESCRIPTION

To make the objectives, technical solutions, and advantages of the present disclosure clearer and more comprehensible, the following further describes the present disclosure in detail with reference to the accompanying drawings and embodiments. It should be understood that the specific embodiments described herein are merely used to explain the present disclosure and are not intended to limit the present disclosure.

In the description of the present disclosure, orientation or position relationships indicated by the terms "inner", "outer", "longitudinal", "transverse", "upper", "lower", "top", "bottom", and the like are orientation or position relationships shown based on the accompanying drawings, and are merely for the convenience of description of the present disclosure, rather than for requiring the present disclosure to be constructed and operated in a specific orientation. Therefore, these terms should not be understood as a limitation to the present disclosure.

Furthermore, the technical features involved in various implementations of the present disclosure described below may be combined with each other as long as they do not conflict with each other.

For the convenience of description in various embodiments of the present disclosure, "highest coupling efficiency" is defined as highest coupling efficiency that can be achieved from an active device to an optical waveguide at a fixed operating wavelength, waveguide shape, and gap; "6 dB alignment tolerance" is an allowable relative displacement between the active device and the waveguide when the coupling efficiency is greater than or equal to 25% (a 6 dB insertion loss). These two parameters will be used as indicators to measure the pros and cons of the design.

Embodiment 1

Figure 1:
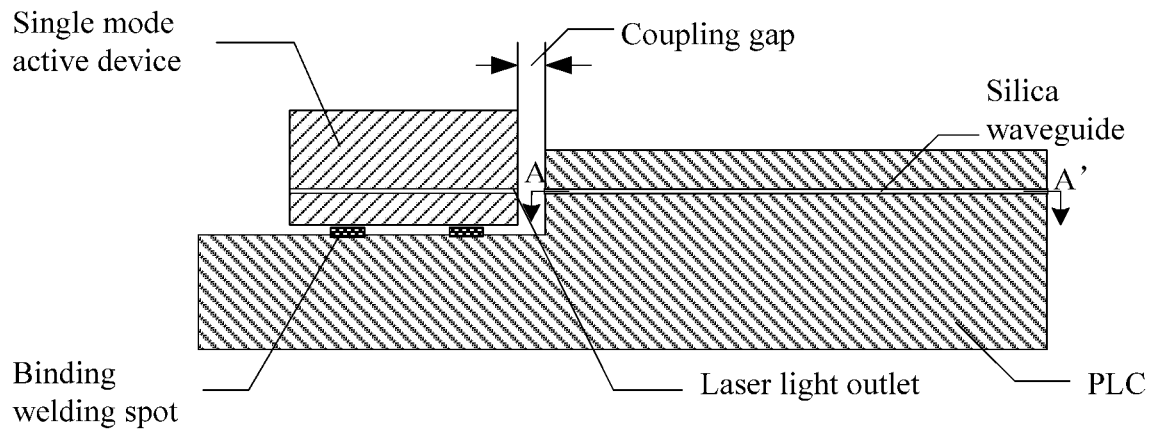
FIG. 1 is a schematic view of a coupling structure based on a planar optical waveguide according to an embodiment of the present disclosure.

Embodiment 1 of the present disclosure provides a coupling structure based on a planar optical waveguide. The structure includes a single mode active device and a planar optical waveguide PLC, as shown in FIG. 1, specifically:

the planar optical waveguide PLC includes a silica waveguide for transmitting an optical signal, where the silica waveguide includes a coupling section and a conduction section.

The single mode active device includes, but is not limited to, a Fabry-Perot (FP) laser, a distributed feedback (DFB) laser, and an electro-absorption modulated laser (EML), and a semiconductor optical amplifier (SOA).

Figure 2:
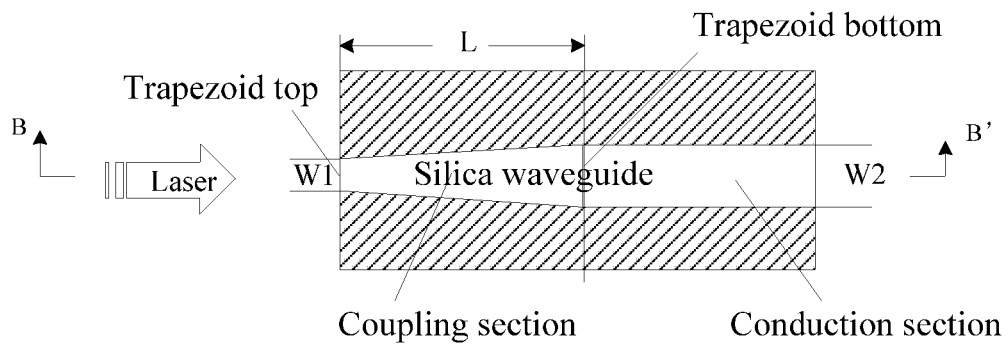
FIG. 2 is a partial enlarged view of a top view of an A-A' cross section of a regular trapezoidal structure in FIG. 1 according to an embodiment of the present disclosure.
Figure 4:
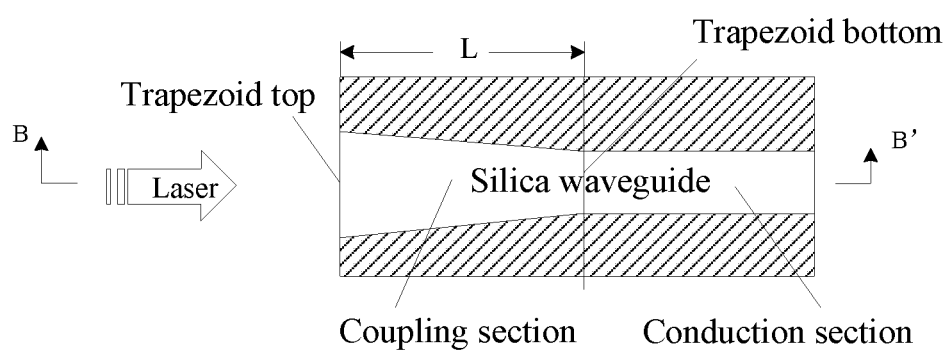
FIG. 4 is a partial enlarged view of a top view of an A-A' cross section of an inverted trapezoidal structure in FIG. 1 according to an embodiment of the present disclosure.
Figure 5:
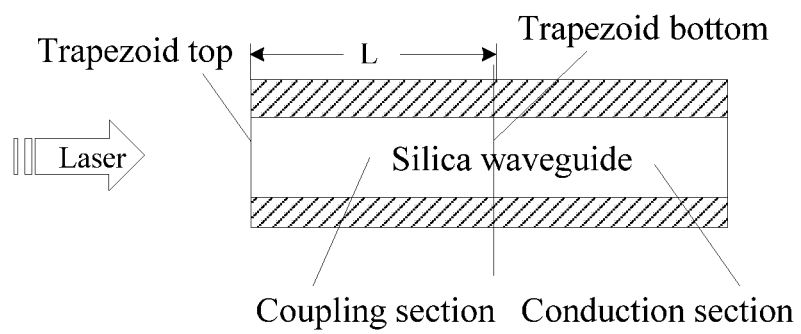
FIG. 5 is a partial enlarged view of a cross-section, taken with reference to a B-B' cross section in FIG. 4, of the inverted trapezoidal structure in FIG. 1 according to an embodiment of the present disclosure.

The coupling section is of a regular trapezoidal structure or an inverted trapezoidal structure, where a surface of the coupling section coupled to the single mode active device is a trapezoid top, and a surface of the coupling section connected with the conduction section is a trapezoid bottom. As shown in FIG. 2, FIG. 2 is a top view of an A-A' cross section in FIG. 1, and shows a schematic view of a regular trapezoidal structure. As shown in FIG. 4, FIG. 4 is a top view of the A-A' cross section in FIG. 1, and shows a schematic view of an inverted trapezoidal structure. FIG. 5 is a partial enlarged view of a cross-section, taken with reference to a B-B' cross section in FIG. 4, of the inverted trapezoidal structure in FIG. 1 according to an embodiment of the present disclosure.

A coupling gap d is preset between the single mode active device and the planar optical waveguide.

The coupling structure based on a planar optical waveguide and proposed in this embodiment of the present disclosure can complete passive alignment and direct coupling of the laser to the PLC, so that alignment tolerance can be improved compared with the prior art. Based on the improvement of the alignment tolerance, a requirement for process precision of an automatic device can be further reduced, alignment and welding time can be shortened, and a defective rate can be further reduced, thereby achieving a purpose of reducing costs.

To ensure that the planar optical waveguide-based coupling structure designed in this embodiment of the present disclosure can be more efficiently completed in a manufacturing process of an industrial automatic device and the defect rate can be reduced, there is a preferred implementation solution, specifically: the coupling gap d has a value of 5 μm to 50 μm, and the coupling gap is filled with a matching gel for refractive index matching. The matching gel is configured to protect an optical path from external erosion while completing the refractive index matching.

With reference to this embodiment of the present disclosure, a coupling device including the single mode active device and the planar optical waveguide can be applied to various known optical modules such as an EPON optical module, a GPON optical module, high-speed single-channel optical modules SFP and SFP+ in data communication, or parallel modules QSFP and QSFP28 for 40G and 100G optical transmission.

Embodiment 2

Figure 3:
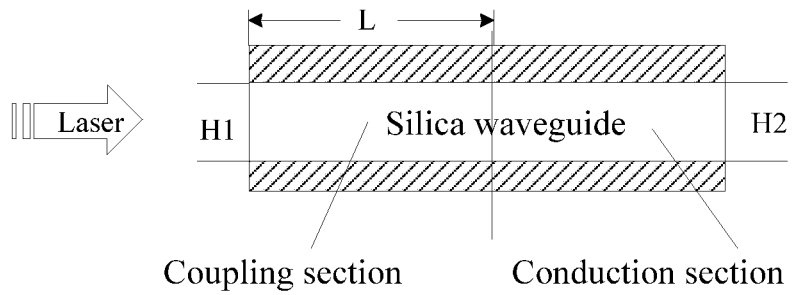
FIG. 3 is a partial enlarged view of a cross-section, taken with reference to a B-B' cross section in FIG. 2, of the regular trapezoidal structure in FIG. 1 according to an embodiment of the present disclosure.

Embodiment 1 of the present disclosure provides the coupling structure based on a planar optical waveguide, and the planar optical waveguide structure used in Embodiment 1 is described in detail below. The planar optical waveguide structure includes a silica waveguide for transmitting an optical signal, as shown in FIG. 2 and FIG. 3, specifically:

the silica waveguide includes a coupling section and a conduction section;

the coupling section is of a regular trapezoidal structure or an inverted trapezoidal structure, where a surface of the coupling section for being coupled to the single mode active device is a trapezoid top, and a surface of the coupling section connected with the conduction section is a trapezoid bottom.

An embodiment of the present disclosure provides a preferred implementation solution from the perspective of process complexity of manufacturing the planar optical waveguide structure. Four side faces of the regular trapezoidal structure or the inverted trapezoidal structure relative to the trapezoid top and the trapezoid bottom include a set of parallel faces and a set of inclined planes. Moreover, the parallel faces are perpendicular to a growth direction of the planar optical waveguide. According to the preferred implementation solution, a process difficulty of growing the planar optical waveguide can be reduced. With reference to this embodiment of the present disclosure, there are still two alternative implementation solutions:

Solution 1: The four side faces of the regular trapezoidal structure or the inverted trapezoidal structure relative to the trapezoid top and the trapezoid bottom include a set of parallel faces and a set of inclined planes. Moreover, the parallel faces are perpendicular to a horizontal plane of the planar optical waveguide.

Solution 2: The four side faces of the regular trapezoidal structure or the inverted trapezoidal structure relative to the trapezoid top and the trapezoid bottom include two sets of inclined planes.

The foregoing two alternative implementation solutions can also achieve an effect of improving alignment tolerance, but complexity of a manufacturing process is higher than that of the preferred solution.

With reference to this embodiment of the present disclosure, to be applicable to the coupling structure in Embodiment 1 and further improve efficiency of industrial automatic processing, there is a preferred implementation solution: A single mode active device mounting base is disposed on the planar optical waveguide, and a bonding pad and an alignment mark are disposed on the base. Correspondingly, the single mode active device is provided with a bonding pad for eutectic bonding or thermo-compression bonding and an alignment mark that matches the planar optical waveguide.

With reference to this embodiment of the present disclosure, a set of implementable parameters are provided. Specifically, a trapezoid top surface width W1 of the coupling section=2.6 μm, and a trapezoid top surface height H1=4.4 μm; a trapezoid bottom surface width W2=3.3 μm, and a trapezoid bottom surface height H2=4.4 μm; and a trapezoid length L=800 μm. Correspondingly, a width W of the conduction section=3.3 μm and a height H=4.4 μm.

Embodiment 3

Figure 6:
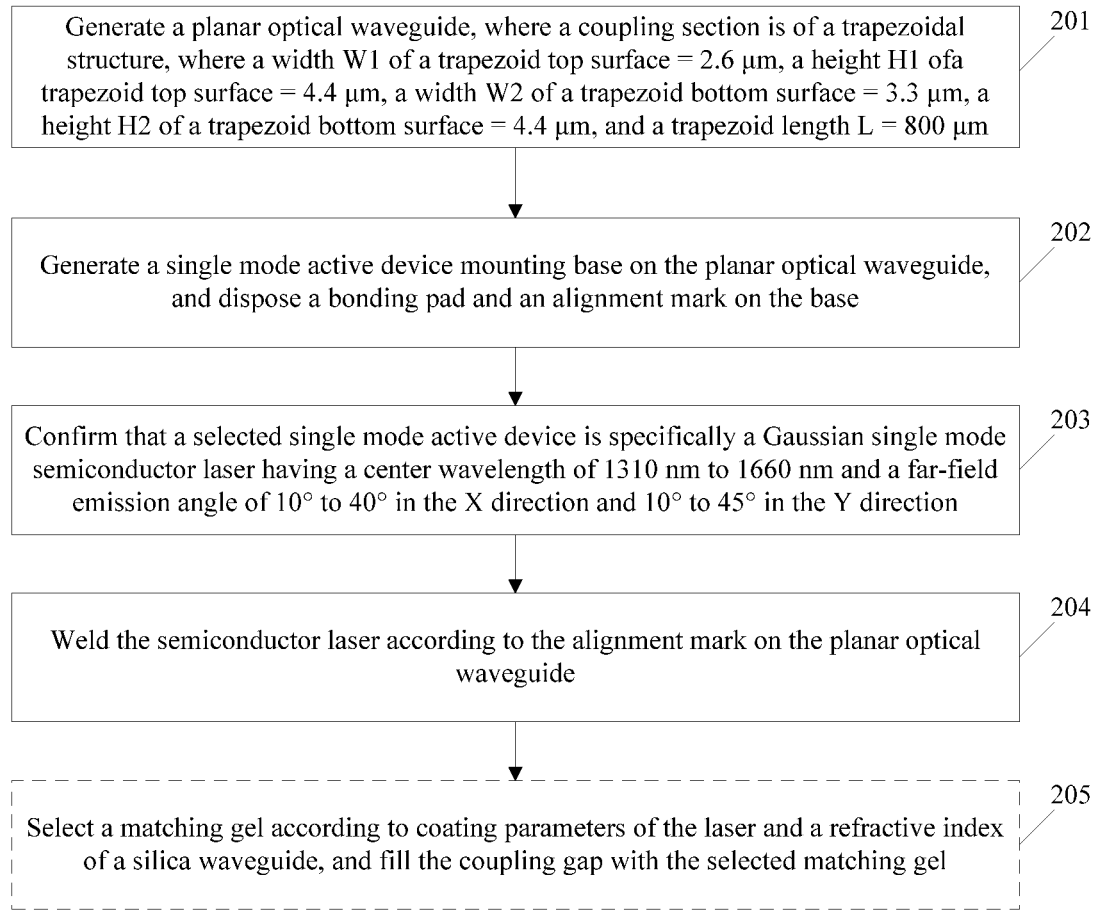
FIG. 6 is a schematic flowchart of a coupling method based on a planar optical waveguide according to an embodiment of the present disclosure.

In addition to the coupling structure described in Embodiment 1 and the planar optical waveguide structure described in Embodiment 2, based on the foregoing structure, this embodiment of the present disclosure provides a coupling method based on a planar optical waveguide. A silica waveguide in the planar optical waveguide includes a coupling section and a conduction section. As shown in FIG. 6, the method includes:

Step 201: Generate the planar optical waveguide, where the coupling section is of a trapezoidal structure, where a trapezoid top surface width W1=2.6 μm, and a trapezoid top surface height H1=4.4 μm; a trapezoid bottom surface width W2=3.3 μm, and a trapezoid bottom surface height H2=4.4 μm; and a trapezoid length L=800 μm.

Preferably, the PLC waveguide in this embodiment of the present disclosure is a silicon-based silica embedded rectangular waveguide, where the outside of a coupling section core layer and the outside of a conduction section core layer are provided with cladding layers having a same refractive index, and a relative refractive index difference of the inside and the outside of each core layer is 0.013.

Step 202: Generate a single mode active device mounting base on the planar optical waveguide, and dispose a bonding pad and an alignment mark on the base.

As shown in FIG. 1, a binding welding spot is formed after the planar optical waveguide is welded to a bonding pad of a single mode active device.

Step 203: Confirm that a selected single mode active device is specifically a Gaussian single mode semiconductor laser having a center wavelength of 1310 nm to 1660 nm and a far-field emission angle of 10° to 40° in the X direction and 10° to 45° in the Y direction.

Step 204: Weld the semiconductor laser according to the alignment mark on the planar optical waveguide.

With reference to this embodiment of the present disclosure, there is a preferred implementation, and this implementation better conforms to an actual situation of industrial automation manufacturing. To be specific, after the single mode active device and the planar optical waveguide are welded together, there is a preset coupling gap d between the two, and after step 204 is executed, the method further includes:

Step 205: Select a matching gel according to coating parameters of the laser and a refractive index of the silica waveguide, and fill the coupling gap with the selected matching gel.

Figure 7:
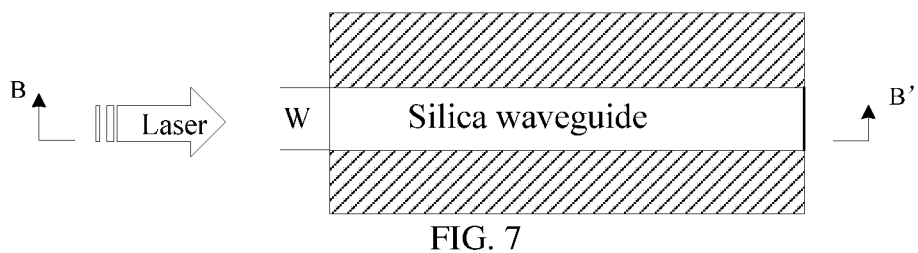
FIG. 7 is a partial enlarged view of a top view of an A-A' cross section in the prior art according to an embodiment of the present disclosure.
Figure 8:
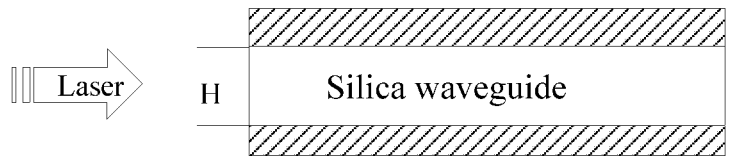
FIG. 8 is a partial enlarged view of a B-B' cross section in FIG. 7 in the prior art according to an embodiment of the present disclosure.

FIG. 7 and FIG. 8 show an unoptimized planar optical waveguide PLC, where W=3.3 μm and H=4.4 μm. If the waveguide, combined with the laser (the single mode active device), on the PLC is not optimized, as shown in FIG. 7 and FIG. 8, a front end and a back end are of a same size in the prior art, and highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs.

Because the coupling efficiency and the 6 dB alignment tolerance vary with a shape of the waveguide, in this embodiment of the present disclosure, the shape of the waveguide is optimized, to obtain a 5 μm coupling gap, and under the application conditions (the laser has a center wavelength of 1310 nm, a far-field emission angle of 25°×40°, and a light-emitting surface refractive index of 1.48) of adding the matching gel (with a refractive index of 1.48), an optimal waveguide shape is shown in FIG. 2 and FIG. 3, where W1=2.6 μm and H1=4.4 μm; W2=3.3 μm, and H2=4.4 μm; and L=800 μm. Because a shape of the PLC in a horizontal direction is easily implemented during manufacturing, but it is relatively difficult to implement a shape in a vertical direction, in the present disclosure, a same size is preferentially used in the vertical direction, and a tapered waveguide is added only in the horizontal direction (to be specific, the waveguide is extended in the horizontal direction and has an equal height in the vertical direction, that is, masks are different in process), so that the highest coupling efficiency and the 6 dB alignment tolerance are improved without adding a PLC manufacturing process.

Figure 9:
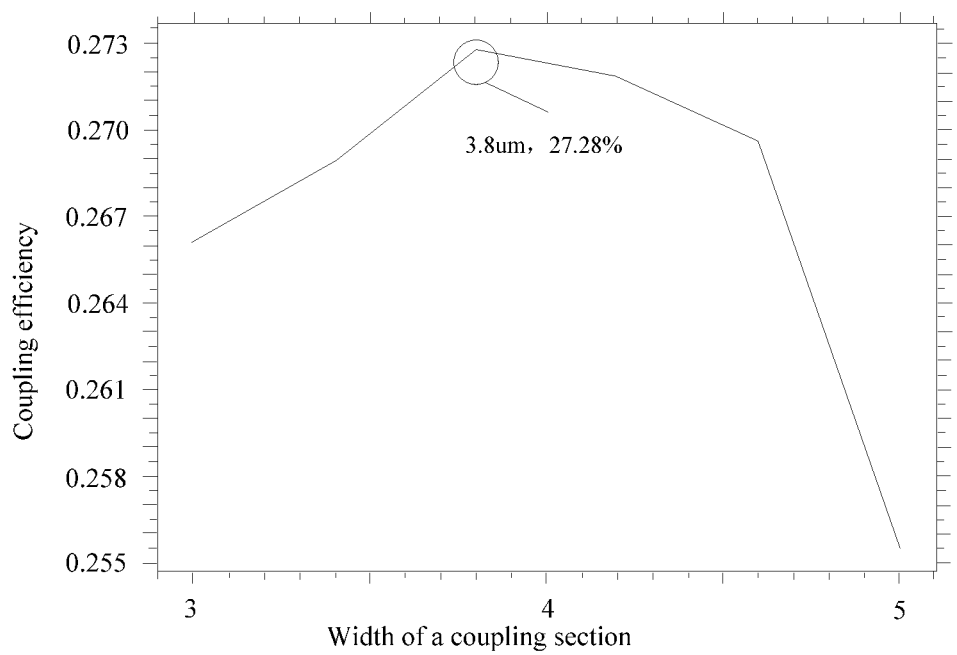
FIG. 9 is a view showing a correspondence between a coupling section width and coupling efficiency according to an embodiment of the present disclosure.
Figure 10:
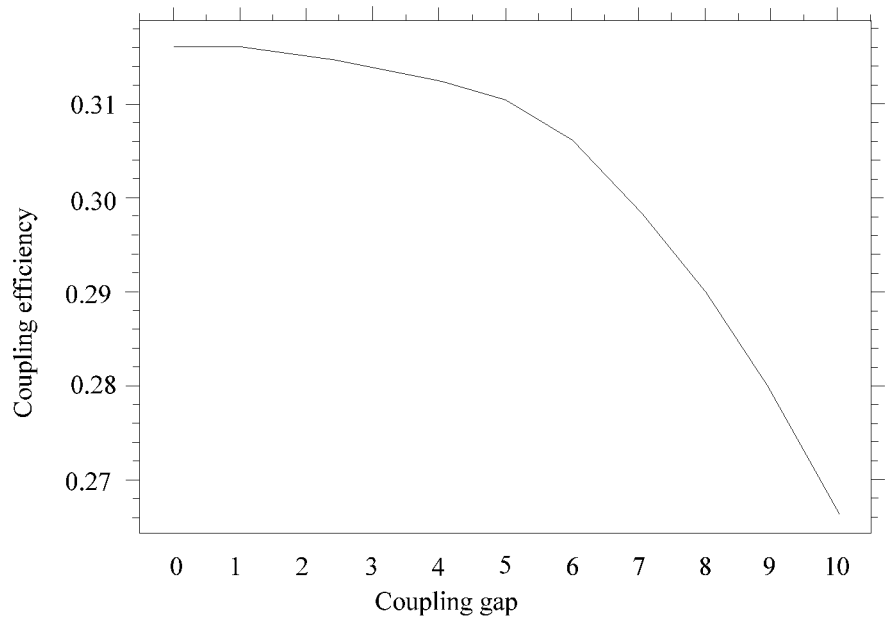
FIG. 10 is a view showing a correspondence between a coupling section width and a coupling gap according to an embodiment of the present disclosure.

Embodiment 3 of the present disclosure provides only a parameter example, and the present disclosure further provides a view of a correspondence between coupling efficiency and a coupling section waveguide width (as shown in FIG. 9, for related parameters of the single mode active device and related parameters of the planar optical waveguide, refer to the related description of this embodiment, and details are not described herein again). Because an impact of the coupling section waveguide width on the coupling efficiency involves various aspects, including the wavelength of the laser, the refractive index difference of the optical waveguide, the light-emitting surface refractive index of the laser, and the like, and in the prior art, there is no formula that can directly derive a relationship between the foregoing several parameters, in the present disclosure, when it is found that the width (or the height) of the coupling section affects the coupling efficiency, a relationship curve chart shown in FIG. 9 and a view of a relationship between coupling efficiency and a coupling gap shown in FIG. 10 are further obtained through simulation. Technical solutions that can be obtained by a person skilled in the art through reasonable deduction on the basis of this are within the protection scope of the present disclosure.

Embodiment 4

With reference to the structures and methods proposed in the foregoing embodiments of the present disclosure, this embodiment provides a corresponding simulation result. In a simulation environment of this embodiment, a single mode active device is specifically a Gaussian single mode semiconductor laser having a center wavelength of 1310 nm and a far-field emission angle of 25°×40°. To match a refractive index of a silica waveguide, a light-emitting surface refractive index of the laser is 1.48; a trapezoid top surface width W1 of a coupling section=2.6 μm, and a trapezoid top surface height H1=4.4 μm; a trapezoid bottom surface width W2=3.3 μm, and a trapezoid bottom surface height H2=4.4 μm; and a trapezoid length L=800 μm. A matching gel has a refractive index of 1.48.

Figure 11:
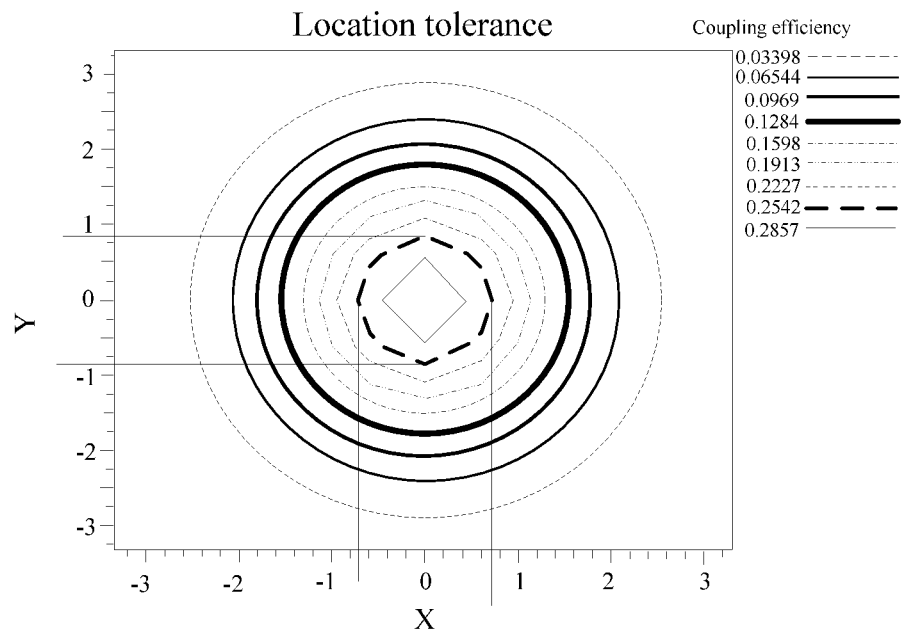
FIG. 11 is a view of location tolerance obtained based on a simulation test according to an embodiment of the present disclosure.

Under the constitution and waveguide shape conditions of the present disclosure, according to the simulation result, as shown in FIG. 11, different curves correspond to different coupling efficiency, for example, a curve of 0.03398 indicates that the coupling efficiency is 3.398%. It is learned that highest coupling efficiency is 30%, and 6 dB alignment tolerance is:

X direction=+/−0.75 μm;
Y direction=+/−0.825 μm.

This result greatly extends the 6 dB alignment tolerance. At present, precision of a commercial automatic binding machine can reach +/−0.5 µm. According to the result of the present disclosure, the laser can be directly mounted on a planar optical waveguide circuit PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 5

Embodiment 5 of the present disclosure provides a structure of a planar optical waveguide. Compared with the single-core planar optical waveguide application scenario in Embodiment 1, this embodiment of the present disclosure focuses on a planar optical waveguide structure proposed based on a hybrid multi-core planar optical waveguide application scenario. As shown in FIG. 12 to FIG. 15, the structure specifically includes the following:

The planar optical waveguide internally includes a silica main waveguide for transmitting an optical signal, and an auxiliary waveguide for assisting light entering;

the auxiliary waveguide includes a silicon nitride auxiliary waveguide that is closely attached to the silica main waveguide.

The silicon nitride auxiliary waveguide may be in various structural forms. For example, the silicon nitride auxiliary waveguide is specifically of a rectangular cubic structure, a regular trapezoidal structure, or an inverted trapezoidal structure.

A hybrid multi-core waveguide proposed in this embodiment is a hybrid multi-core waveguide formed by adding the silicon nitride auxiliary waveguide other than the silica main waveguide to a laser interface end of the PLC, and a purpose is to improve coupling efficiency and alignment tolerance. Because a numerical aperture NA of the silicon nitride waveguide is high, a light-receiving capability of the waveguide is stronger than that of the silica waveguide. A function of the hybrid multi-core waveguide is equivalent to adding a light inlet having a higher light-receiving capability. After a transition, all auxiliary waveguides disappear, so that light entering from the additional light inlet is merged into the main waveguide through parallel coupling of the waveguide, to achieve the purpose of improving the coupling efficiency and the alignment tolerance.

With reference to this embodiment of the present disclosure, there is a preferred implementation solution, where the silica main waveguide includes a coupling section and a conduction section.

The coupling section is of a regular trapezoidal structure or an inverted trapezoidal structure, where a surface of the coupling section coupled to a single mode active device is a trapezoid top, and a surface of the coupling section connected with the conduction section is a trapezoid bottom.

Embodiment 6

Based on the planar optical waveguide structure described in Embodiment 5, Embodiment 6 of the present disclosure specifically describes an optional auxiliary waveguide structure. Specifically, the auxiliary waveguide not only includes a silicon nitride auxiliary waveguide, but also includes a silica auxiliary waveguide. As shown in FIG. 16, FIG. 17, FIG. 18, and FIG. 19, a specific structure is described as follows:

The planar optical waveguide internally includes a silica main waveguide for transmitting an optical signal, and an auxiliary waveguide for assisting light entering.

The silicon nitride auxiliary waveguide and the silica auxiliary waveguide each include a transition portion and a cone portion. The transition portion is a rectangular cube extending in a direction of light transmission, and the cone portion is of a structure with a bottom surface connected with the transition portion and a cone top extending in the direction of light transmission. The silicon nitride auxiliary waveguide is located on an upper surface of the silica main waveguide, and the silica auxiliary waveguide is located on an upper surface of the silica main waveguide and covers the silicon nitride auxiliary waveguide.

With reference to the structure of Embodiment 6, there is a preferred size, referring to FIG. 16 to FIG. 19:

a width $W_{main}$ of a light inlet of the silica main waveguide=5.0 µm, and a height $H_{main}$=3.0 µm;

a width $W_{auxiliary\ 1\ in}$ of a light inlet of the silica auxiliary waveguide=5.0 µm, and a height $H_{auxiliary\ 1\ in}$=3.0 µm;

a length $L_{auxiliary\ 1\ transition}$ of the transition portion of the silica auxiliary waveguide=100 µm;

a total length $L_{auxiliary\ 1\ total}$ of the silica auxiliary waveguide (including the transition portion and the cone portion)=600 µm;

a width $T_{auxiliary\ 1}$ of the cone top of the silica auxiliary waveguide=0.1 µm;

a width $W_{auxiliary\ 2\ in}$ of a light inlet of the silicon nitride auxiliary waveguide=2.0 µm, and a height $H_{auxiliary\ 2\ in}$=0.06 µm;

a length $L_{auxiliary\ 2\ transition}$ of the transition portion of the silicon nitride auxiliary waveguide=100 µm;

a total length $L_{auxiliary\ 2\ total}$ of the silicon nitride auxiliary waveguide (including the transition portion and the cone portion)=500 µm;

a width $T_{auxiliary\ 2}$ of the cone top of the silicon nitride auxiliary waveguide=0.1 µm.

Figure 20:
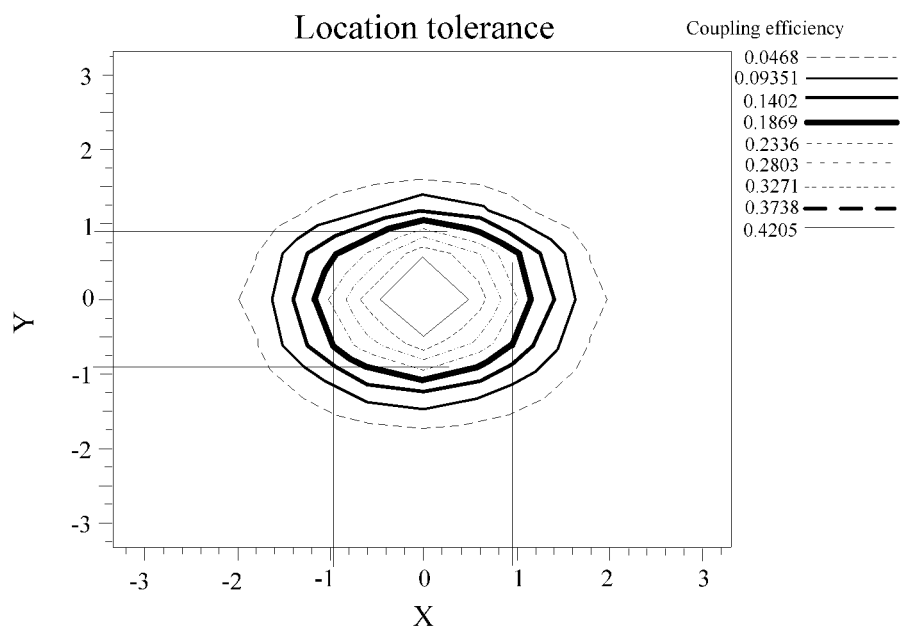
FIG. 20 is a view of location tolerance obtained based on a simulation test according to an embodiment of the present disclosure.

There is no gap between the main waveguide and the auxiliary waveguide. All of these dimensions need to be determined through optimization based on application conditions (an operating wavelength, a PLC function, a process condition, and the like). The planar optical waveguide with these parameters is suitable for a Gaussian single mode semiconductor laser having a center wavelength of 1310 nm to 1660 nm and a far-field emission angle of 10° to 40° in the X direction and 10° to 45° in the Y direction. If a front end and a back end have a same size in the prior art (a single waveguide), highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs. In this embodiment, a Gaussian single mode semiconductor laser having a center wavelength of 1310 nm and a far-field emission angle of 25°×40° is used for simulation testing to obtain a schematic view of location tolerance shown in FIG. 20.

In Embodiment 6 of the present disclosure, the planar optical waveguide structure is improved sufficiently, and the highest coupling efficiency reaches 46.6%.

The 6 dB alignment tolerance (shown in FIG. 20) reaches the following in the X and Y directions respectively:

X direction=+/−0.95 µm;

Y direction=+/−0.95 µm.

Compared with a method of a single waveguide, according to the foregoing result, the highest coupling efficiency is improved, and further, the 6 dB alignment tolerance is extended. At present, precision of a commercial automatic binding machine can reach +/−0.5 According to the result of this embodiment of the present disclosure, the laser can be directly mounted on the PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 7

Figure 21:
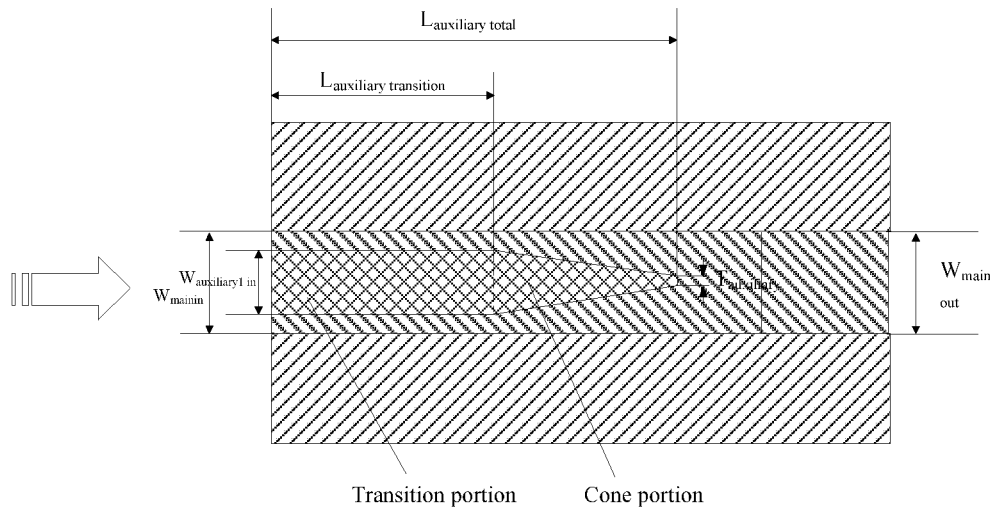
FIG. 21 is a partial enlarged view of a top view of the A-A' cross section in FIG. 12 according to an embodiment of the present disclosure.
Figure 22:
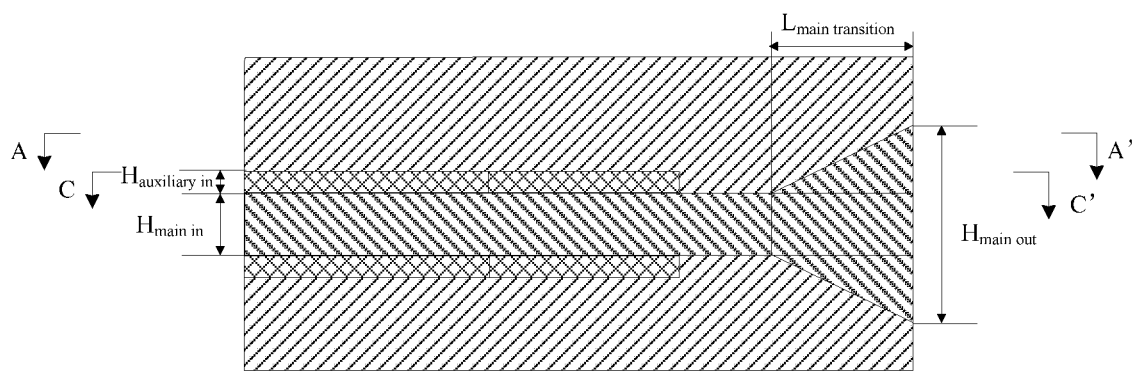
FIG. 22 is a partial enlarged view of a front view of a corresponding portion of FIG. 21 in FIG. 12 according to an embodiment of the present disclosure.
Figure 23:
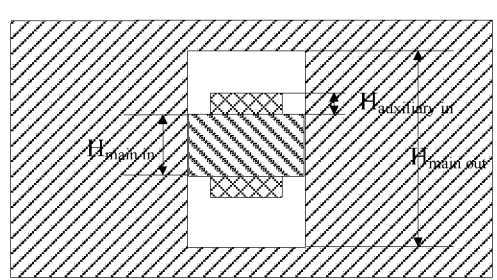
FIG. 23 is a partial enlarged view of a left view of the B-B' cross section in FIG. 12 relative to FIG. 21 according to an embodiment of the present disclosure.

Based on the planar optical waveguide structure described in Embodiment 5, Embodiment 7 of the present disclosure specifically describes an optional auxiliary waveguide structure, as shown in FIG. 21, FIG. 22, and FIG. 23. Specifically, a silicon nitride auxiliary waveguide includes two sub-auxiliary waveguides, where a first sub-auxiliary waveguide is located on an upper surface of a silica main waveguide, and a second sub-auxiliary waveguide is located on a lower surface of the silica main waveguide.

With reference to this embodiment of the present disclosure, there is a preferred implementation solution. As shown in FIG. 21, the first sub-auxiliary waveguide and the second sub-auxiliary waveguide each include a transition portion and a cone portion, where the transition portion is a rectangular cube extending in a direction of light transmission; and the cone portion is of a structure with a bottom surface connected with the transition portion and a cone top extending in the direction of light transmission.

a width $W_{main\ in}$ of a light inlet of the silica main waveguide=3.0 μm, and a height $H_{main\ in}$=1.8 μm;

an intermediate transition portion length $L_{main\ transition}$ of the silica main waveguide=500 μm;

a width $W_{main\ out}$ of a light outlet at the rear of the silica main waveguide=3.0 μm, and a height $H_{main\ out}$=4.0 μm;

a width $W_{auxiliary\ in}$ of a light inlet of the silicon nitride auxiliary waveguide=1.8 μm, and a height $H_{auxiliary\ in}$=0.048 μm;

a length $L_{auxiliary\ transition}$ of the transition portion of the silicon nitride auxiliary waveguide=400 μm;

a total length $L_{auxiliary\ total}$ of the silicon nitride auxiliary waveguide (including the transition portion and the cone portion)=500 μm;

a width $T_{auxiliary}$ of the cone top of the silicon nitride auxiliary waveguide=0.1 μm.

There is no gap between the main waveguide and the auxiliary waveguide. All of these dimensions need to be determined through optimization based on application conditions (an operating wavelength, a PLC function, a process condition, and the like). The planar optical waveguide with these parameters is suitable for a Gaussian single mode semiconductor laser having a center wavelength of 1310 nm to 1660 nm and a far-field emission angle of 10° to 40° in the X direction and 10° to 45° in the Y direction. If a front end and a back end have a same size in the prior art, highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs. In this embodiment, a Gaussian single mode semiconductor laser having a center wavelength of 1310 nm and a far-field emission angle of 25°×40° is used for simulation testing to obtain a schematic view of location tolerance shown in FIG. 24.

Figure 24:
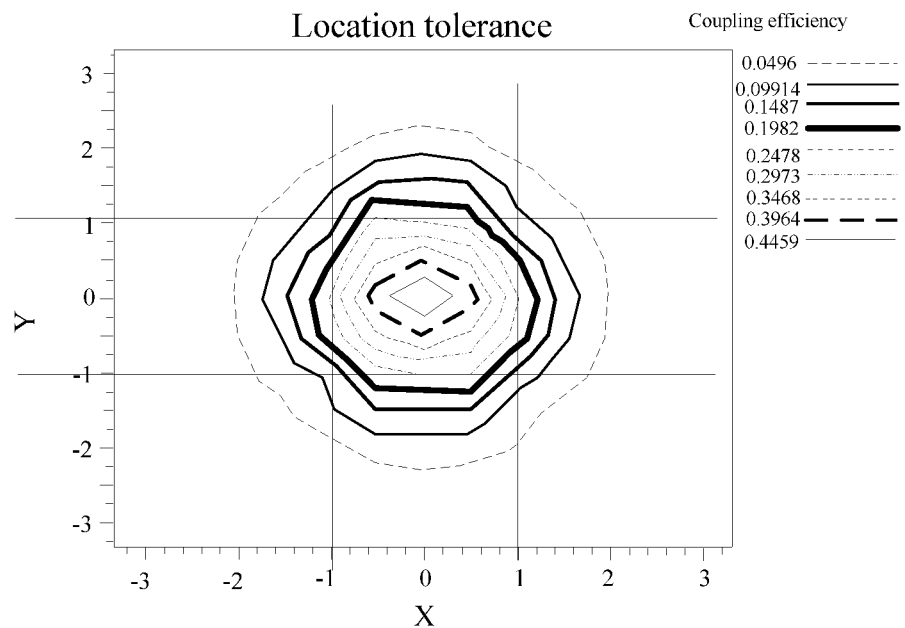
FIG. 24 is a view of location tolerance obtained based on a simulation test according to an embodiment of the present disclosure.

In Embodiment 7 of the present disclosure, the planar optical waveguide structure is improved sufficiently, the highest coupling efficiency reaches 49.43%, and the 6 dB alignment tolerance (as shown in FIG. 24) reaches the following in the X and Y directions respectively:

X direction=+/−1.0 μm;
Y direction=+/−1.0 μm.

Compared with a method of a single waveguide method, according to the foregoing result, the highest coupling efficiency is improved, and further, the 6 dB alignment tolerance is extended. At present, precision of a commercial automatic binding machine can reach +/−0.5 According to the result of this embodiment of the present disclosure, the laser can be directly mounted on the PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 8

Figure 25:
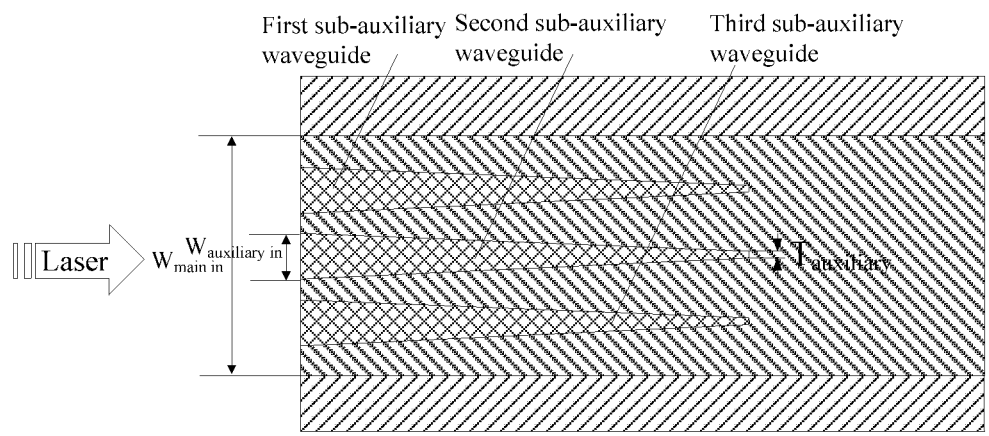
FIG. 25 is a partial enlarged view of a top view of the A-A' cross section in FIG. 12 according to an embodiment of the present disclosure.
Figure 26:
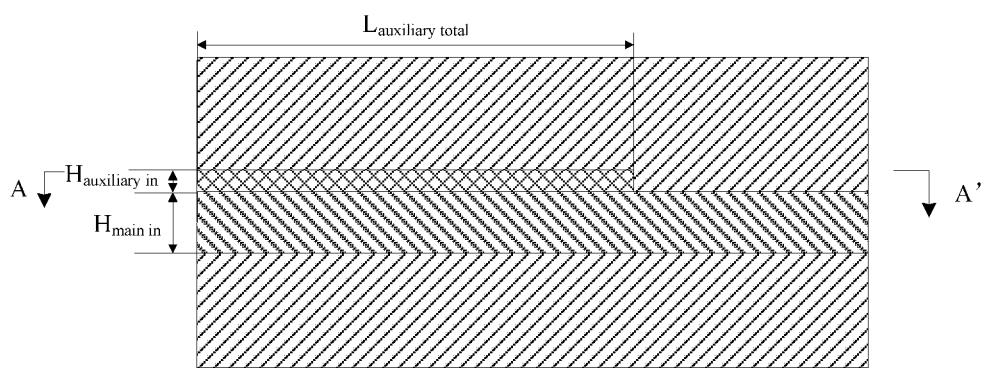
FIG. 26 is a partial enlarged view of a front view of a corresponding portion of FIG. 25 in FIG. 12 according to an embodiment of the present disclosure.
Figure 27:
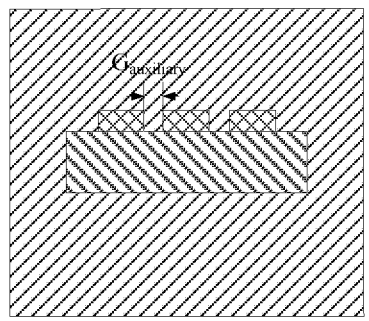
FIG. 27 is a partial enlarged view of a left view of the B-B' cross section in FIG. 12 relative to FIG. 25 according to an embodiment of the present disclosure.

Based on the planar optical waveguide structure described in Embodiment 5, Embodiment 8 of the present disclosure specifically describes an optional auxiliary waveguide structure, as shown in FIG. 25, FIG. 26, and FIG. 27. Specifically, a silicon nitride auxiliary waveguide includes three sub-auxiliary waveguides, where a first sub-auxiliary waveguide, a second sub-auxiliary waveguide, and a third sub-auxiliary waveguide are located on an upper surface of a silica main waveguide; the three sub-auxiliary waveguides are each of a cone structure, where a cone top extends in a direction of light transmission.

With reference to this embodiment of the present disclosure, there is a preferred implementation solution, where the three sub-auxiliary waveguides are spaced apart by a predetermined distance, and the three sub-auxiliary waveguides are arranged in parallel.

A width $W_{main\ in}$ of a light inlet of the silica main waveguide=5.0 μm, and a height $H_{main\ in}$=3.8 μm;

a width $W_{auxiliary\ in}$ of a light inlet of the silicon nitride auxiliary waveguide=1.5 μm, and a height $H_{auxiliary\ in}$=0.05 μm;

a total length $L_{auxiliary\ total}$ of the silicon nitride auxiliary waveguide=1000 μm;

a width $T_{auxiliary}$ of the cone top of the silicon nitride auxiliary waveguide=0.1 μm;

the gap $G_{auxiliary}$ between the silicon nitride auxiliary waveguides=0.1 μm.

The planar optical waveguide with these parameters is suitable for a Gaussian single mode semiconductor laser having a center wavelength of 1310 nm to 1660 nm and a far-field emission angle of 10° to 40° in the X direction and 10° to 45° in the Y direction. If a front end and a back end have a same size in the prior art, highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs. In this embodiment, a Gaussian single mode semiconductor laser having a center wavelength of 1310 nm and a far-field emission angle of 25°×40° is used for simulation testing to obtain a schematic view of location tolerance shown in FIG. 28.

Figure 28:
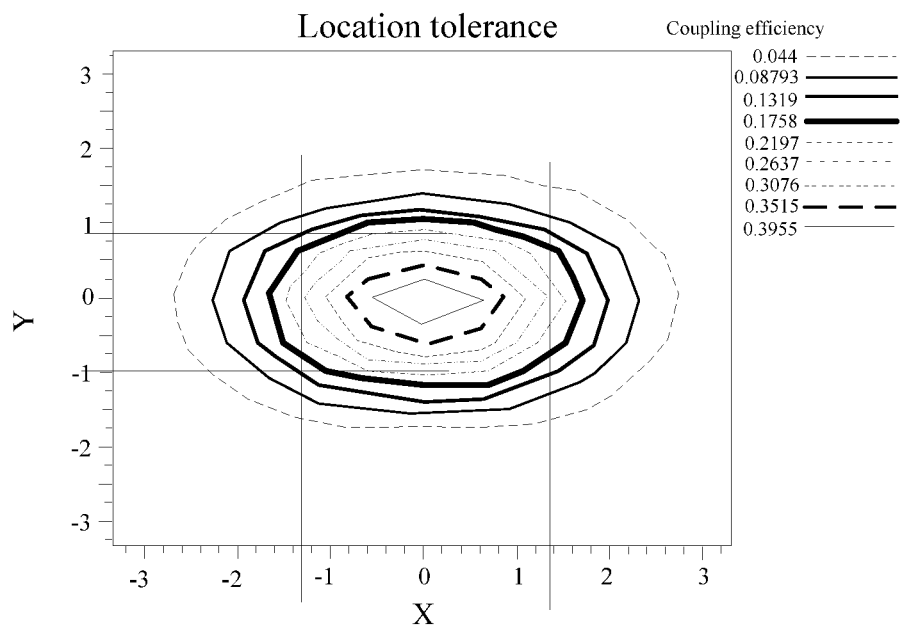
FIG. 28 is a view of location tolerance obtained based on a simulation test according to an embodiment of the present disclosure.

In Embodiment 8 of the present disclosure, the planar optical waveguide structure is improved sufficiently, the highest coupling efficiency reaches 43.7%, and the 6 dB alignment tolerance (as shown in FIG. 28) reaches the following in the X and Y directions respectively:

X direction=+/−1.35 μm;
Y direction=+/−0.95 μm.

A technical effect of a hybrid multi-core waveguide formed by adding a silicon nitride auxiliary waveguide having a large numerical aperture NA is that the present disclosure has very high coupling efficiency in direct coupling of an active device to a planar optical waveguide. At the same time, the 6 dB alignment tolerance also is improved accordingly. At present, precision of a commercial automatic binding machine can reach +/−0.5 μm. According to the result of the present disclosure, the laser can be directly mounted on the PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 9

Figure 12:
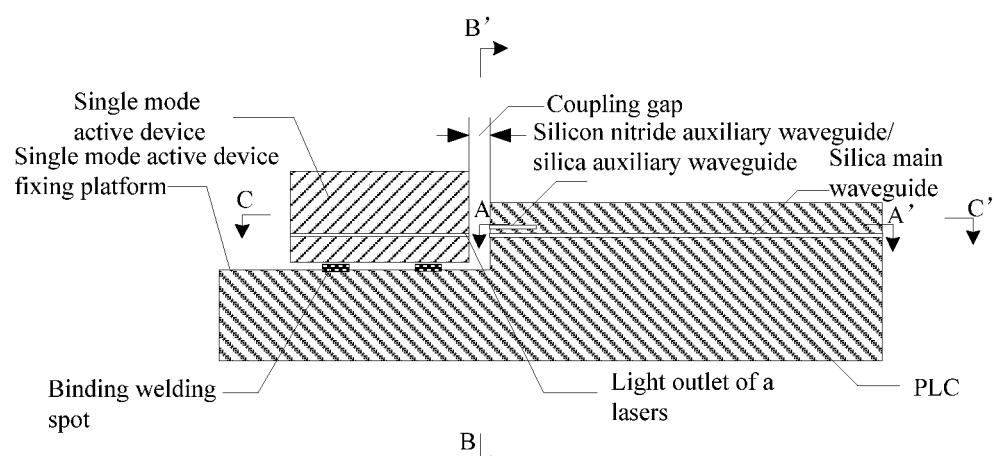
FIG. 12 is a schematic view of a coupling structure based on a planar optical waveguide according to an embodiment of the present disclosure.
Figure 13:
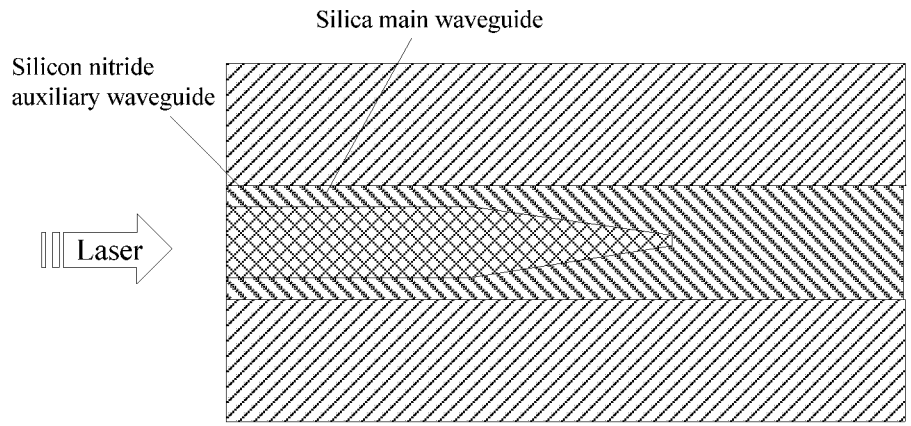
FIG. 13 is a partial enlarged view of a top view of an A-A' cross section in FIG. 12 according to an embodiment of the present disclosure.
Figure 14:
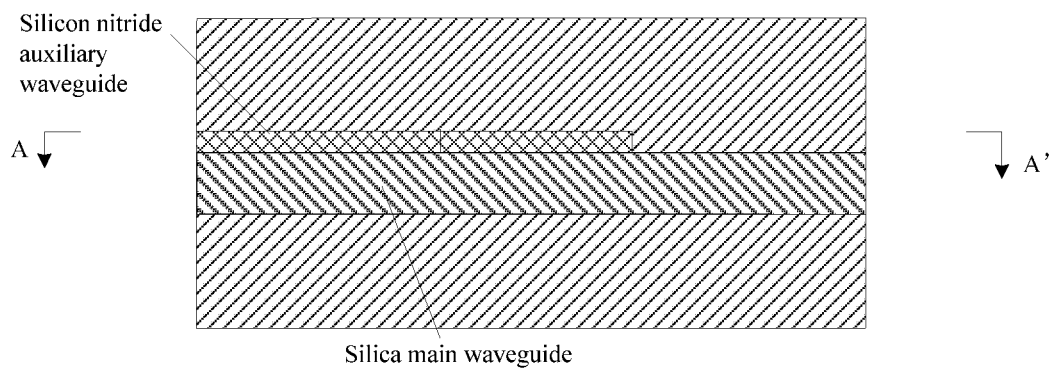
FIG. 14 is a partial enlarged view of a front view of a corresponding portion of FIG. 13 in FIG. 12 according to an embodiment of the present disclosure.
Figure 15:
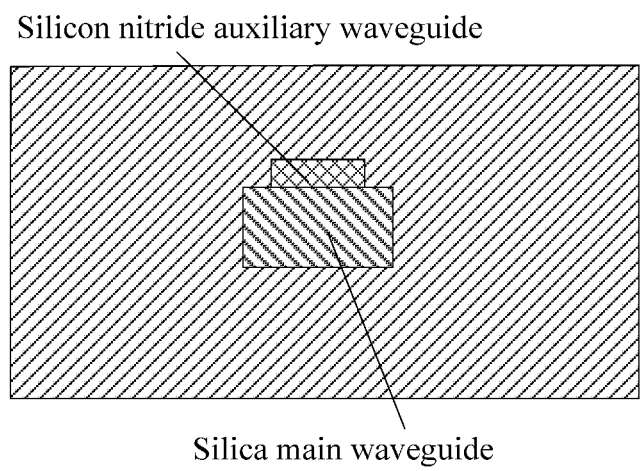
FIG. 15 is a partial enlarged view of a left view of a B-B' cross section in FIG. 12 relative to FIG. 13 according to an embodiment of the present disclosure.
Figure 16:
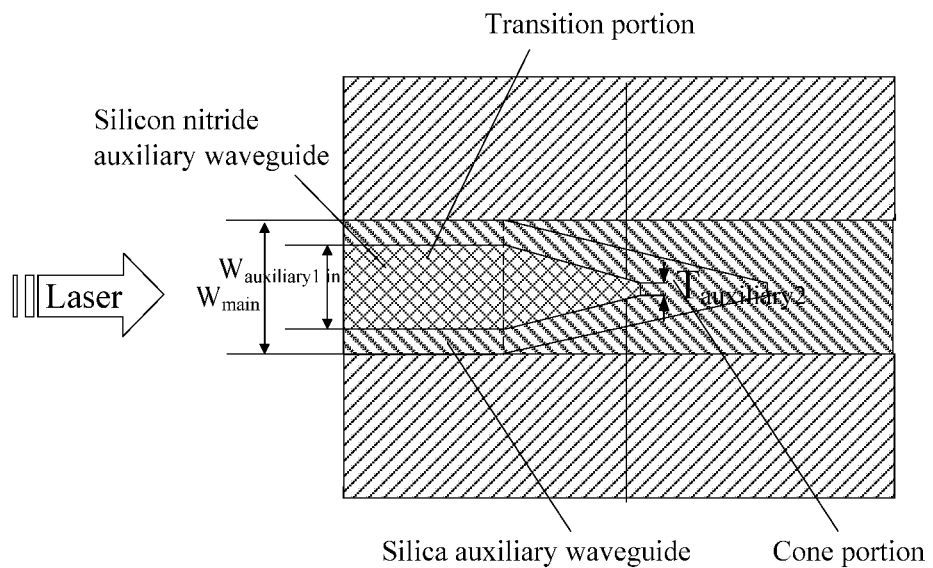
FIG. 16 is a partial enlarged view of a top view of the A-A' cross section in FIG. 12 according to an embodiment of the present disclosure.
Figure 17:
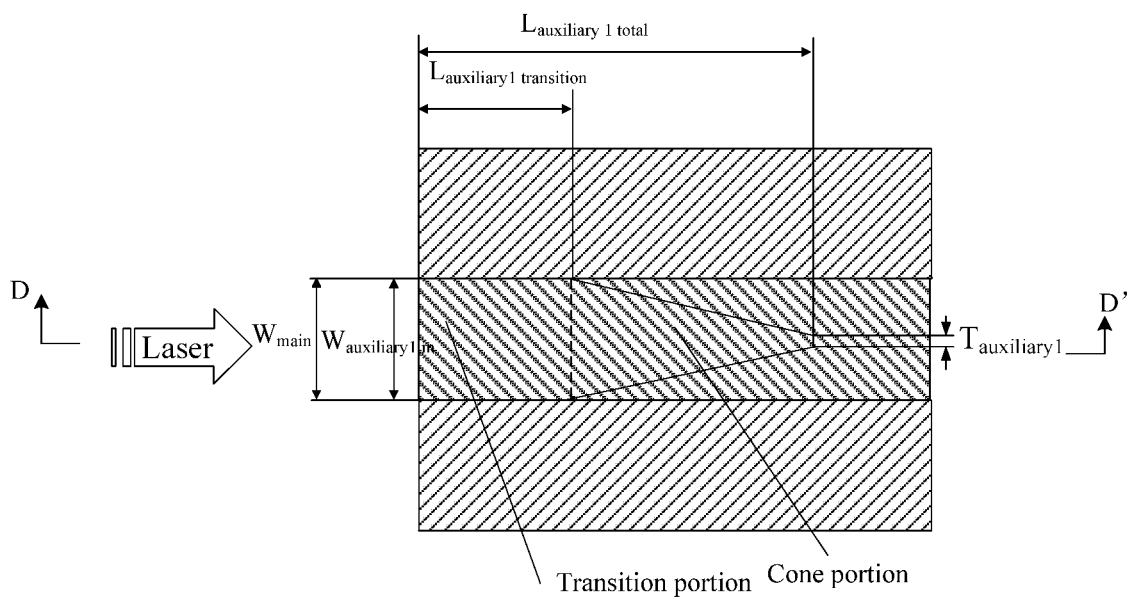
FIG. 17 is a partial enlarged view of a top view of a C-C' cross section in FIG. 12 according to an embodiment of the present disclosure.
Figure 18:
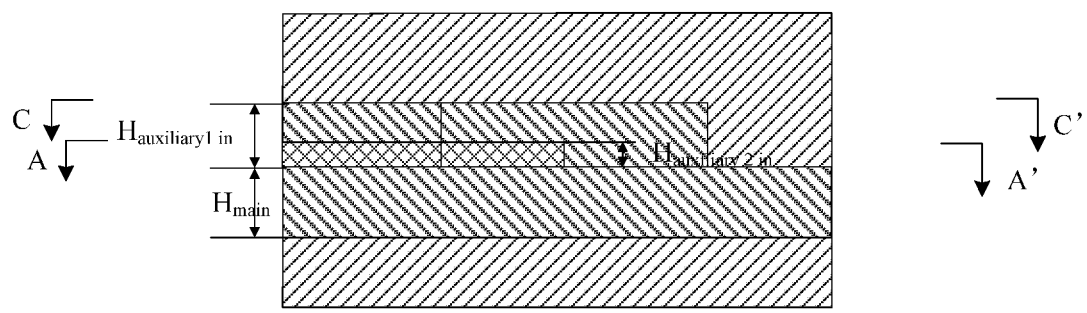
FIG. 18 is a partial enlarged view of a front view of a corresponding portion of FIG. 16 in FIG. 12 according to an embodiment of the present disclosure.
Figure 19:
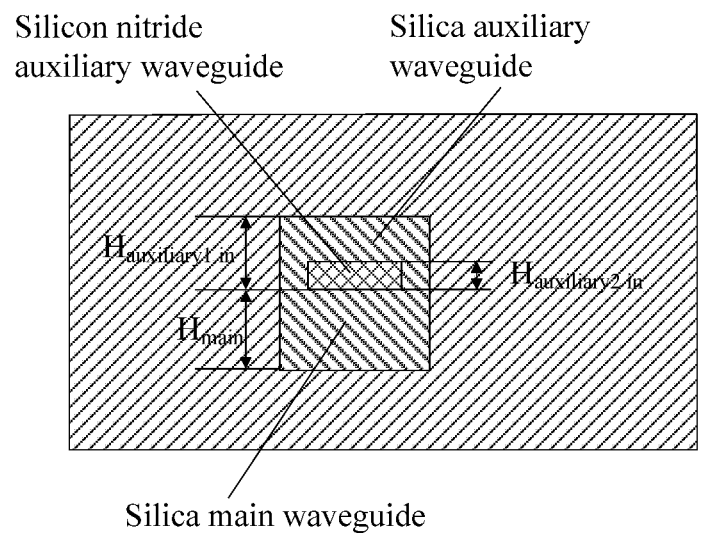
FIG. 19 is a partial enlarged view of a left view of the B-B' cross section in FIG. 12 relative to FIG. 16 according to an embodiment of the present disclosure.

A coupling structure of a planar optical waveguide includes a planar optical waveguide with the structure described in any one of Embodiment 5 to Embodiment 8. The coupling structure further includes a single mode active device, and the single mode active device includes but is not limited to an FP laser, a DFB laser, an EML, and an SOA. As shown in FIG. 12, the coupling structure is specifically as follows:

The planar optical waveguide is provided with a single mode active device fixing platform located on a light-incident side of the silica main waveguide and the silicon nitride auxiliary waveguide;

a bonding pad and an alignment mark are disposed on the fixing platform, where the bonding pad is configured to be welded to a corresponding bonding pad on the single mode active device; and the alignment mark is configured to provide addressing of a binding welding spot for an automatic binding machine.

In the coupling structure, a coupling gap d is formed between the single mode active device and light inlets of the silica main waveguide and the silicon nitride auxiliary waveguide, and the coupling gap is filled with a matching gel for refractive index matching.

Embodiment 10

Figure 29:
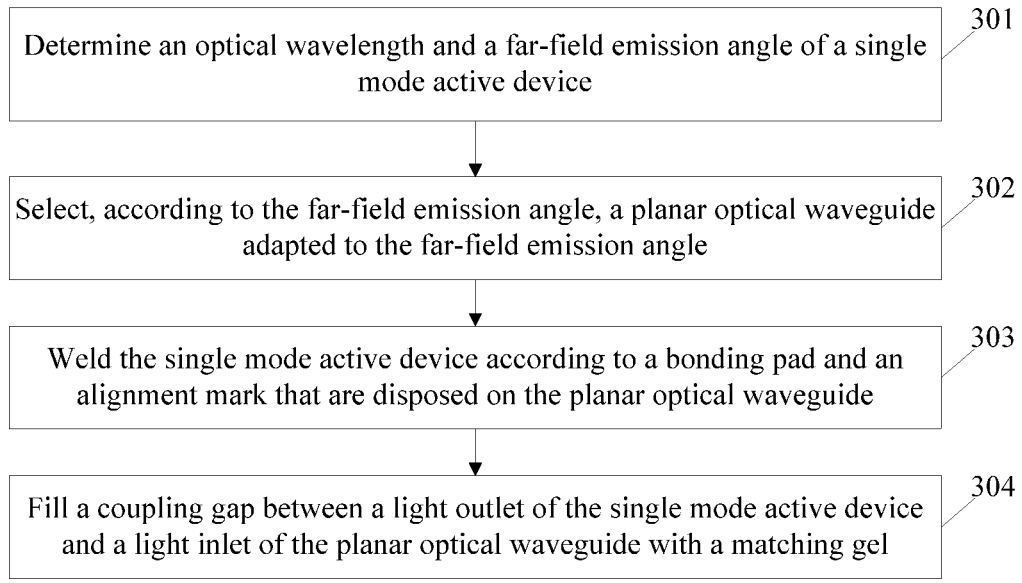
FIG. 29 is a flowchart of a coupling method based on a planar optical waveguide according to an embodiment of the present disclosure.

This embodiment of the present disclosure provides a coupling method of a planar optical waveguide. As shown in FIG. 29, the coupling method includes:

Step 301: Determine an optical wavelength and a far-field emission angle of a single mode active device.

Step 302: Select, according to the far-field emission angle, a planar optical waveguide adapted to the far-field emission angle.

Alternatively, the planar optical waveguide includes each planar optical waveguide described in Embodiment 5 to Embodiment 8.

Step 303: Weld the single mode active device according to a bonding pad and an alignment mark that tare disposed on the planar optical waveguide.

Step 304: Fill a coupling gap between a light outlet of the single mode active device and a light inlet of the planar optical waveguide with a matching gel.

During implementation of this embodiment of the present disclosure, when the planar optical waveguide includes a main waveguide and an auxiliary waveguide, there is a preferred implementation solution of selecting, according to the far-field emission angle, the planar optical waveguide adapted to the far-field emission angle, and the implementation solution specifically includes:

determining, according to the far-field emission angle, that the single mode active device is a transverse elliptical light source or a longitudinal elliptical light source; and if the single mode active device is the transverse elliptical light source, selecting a planar optical waveguide with an auxiliary waveguide embedded in a single-side tiling manner on a main waveguide; or if the single mode active device is the longitudinal elliptical light source, selecting a planar optical waveguide with an auxiliary waveguide embedded in a double-side tiling manner on a main waveguide.

With reference to this embodiment of the present disclosure, there are several preferred implementation solutions for the planar optical waveguide with the auxiliary waveguide embedded in a double-side tiling manner on the main waveguide, specifically:

a silicon nitride auxiliary waveguide includes three sub-auxiliary waveguides, where a first sub-auxiliary waveguide, a second sub-auxiliary waveguide and a third sub-auxiliary waveguide are located on an upper surface of the silica main waveguide; and the three sub-auxiliary waveguides are each of a cone structure, where a cone top extends in a direction of light transmission; or a silicon nitride auxiliary waveguide and a silica auxiliary waveguide each include a transition portion and a cone portion, and the transition portion is a rectangular cube extending in a direction of light transmission; the cone portion is of a structure with a bottom surface connected with the transition portion and a cone top extending in the direction of light transmission; where the silicon nitride auxiliary waveguide is located on an upper surface of the silica main waveguide, and the silica auxiliary waveguide is located on the upper surface of the silica main waveguide and covers the silicon nitride auxiliary waveguide.

The planar optical waveguide with the auxiliary waveguide embedded in a double-side tiling manner on the main waveguide is specifically implemented as follows:

a silicon nitride auxiliary waveguide includes two sub-auxiliary waveguides, where a first sub-auxiliary waveguide is located on an upper surface of the silica main waveguide, and a second sub-auxiliary waveguide is located on a lower surface of the silica main waveguide.

Embodiment 11

Figure 30:
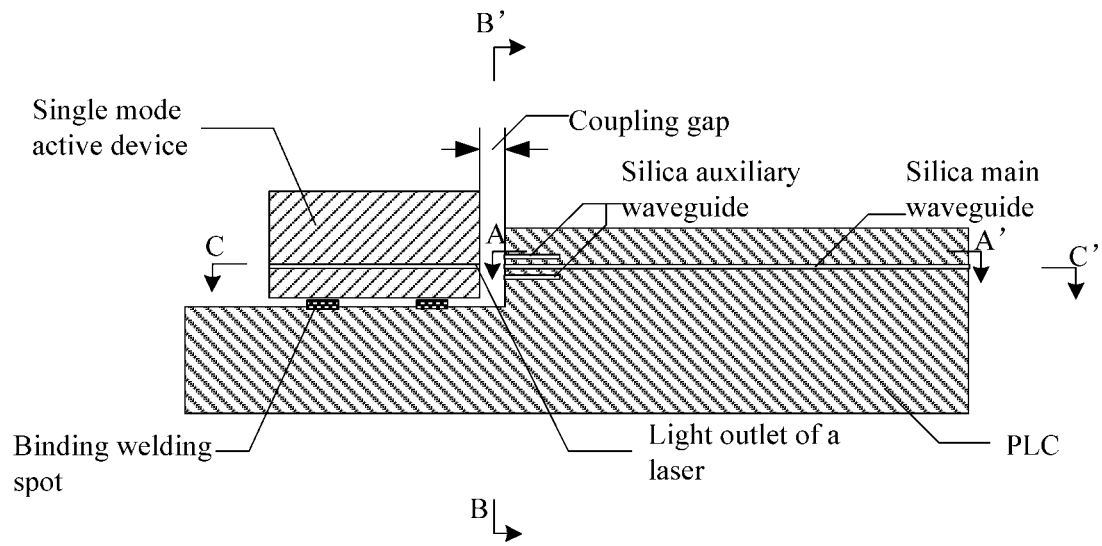
FIG. 30 is a schematic view of a coupling structure of a multi-core planar optical waveguide according to an embodiment of the present disclosure.

Compared with the single-core planar optical waveguide application scenario in Embodiment 1 and the hybrid multi-core planar optical waveguide application scenario in Embodiment 5, Embodiment 11 of the present disclosure provides a multi-core planar optical waveguide structure, as shown in FIG. 30:

The planar optical waveguide internally includes a silica main waveguide for transmitting an optical signal, and an auxiliary waveguide for assisting light entering.

The auxiliary waveguide includes one or more silica auxiliary waveguides that are disposed at a predetermined center distance from the silica main waveguide.

The center distance is used to ensure that the one or more silica auxiliary waveguides and the silica main waveguide produce a sufficient coupling effect on light receiving surfaces.

The planar optical waveguide structure including one or more silica auxiliary waveguides and proposed in this embodiment of the present disclosure can complete passive alignment and direct coupling of the laser to the PLC, so that alignment tolerance can be improved compared with the prior art. Based on improvement of the alignment tolerance, a requirement for process precision of an automatic device can be further reduced, alignment and welding time can be shortened, and a defective rate can be further reduced, thereby achieving a purpose of reducing costs.

Figure 31:
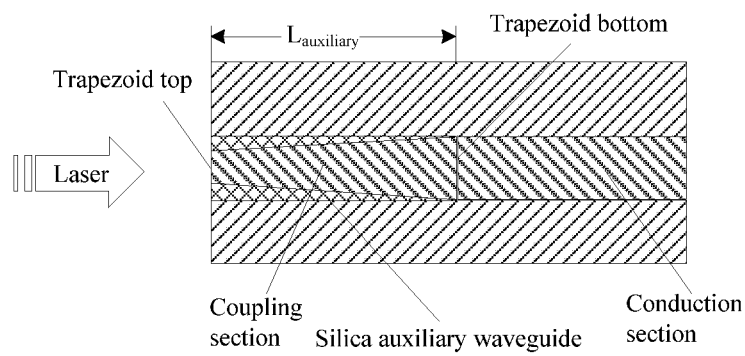
FIG. 31 is a partial enlarged view of a top view of a C-C' cross section in FIG. 30 according to an embodiment of the present disclosure.

With reference to this embodiment of the present disclosure, there is a preferred implementation solution. As shown in FIG. 31, the silica main waveguide includes a coupling section and a conduction section. The coupling section is of a regular trapezoidal structure or an inverted trapezoidal structure, where a surface of the coupling section coupled to a single mode active device is a trapezoid top, and a surface of the coupling section connected with the conduction section is a trapezoid bottom.

Embodiment 12

Figure 32:
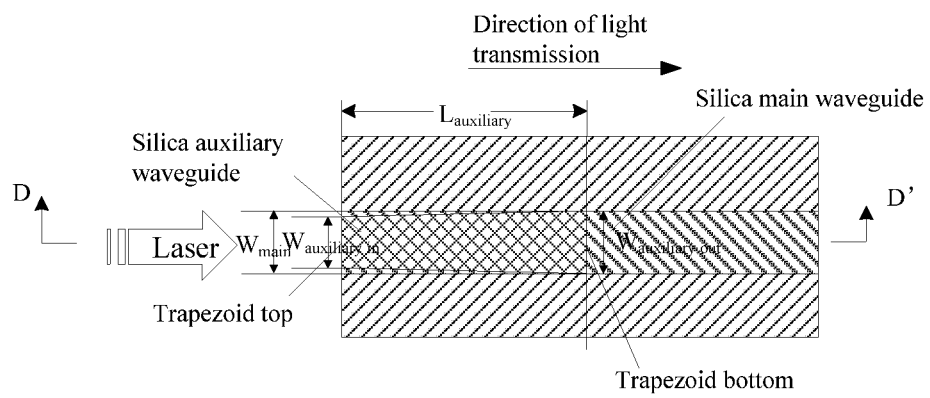
FIG. 32 is a partial enlarged view of a top view of a A-A' cross section in FIG. 30 according to an embodiment of the present disclosure.
Figure 33:
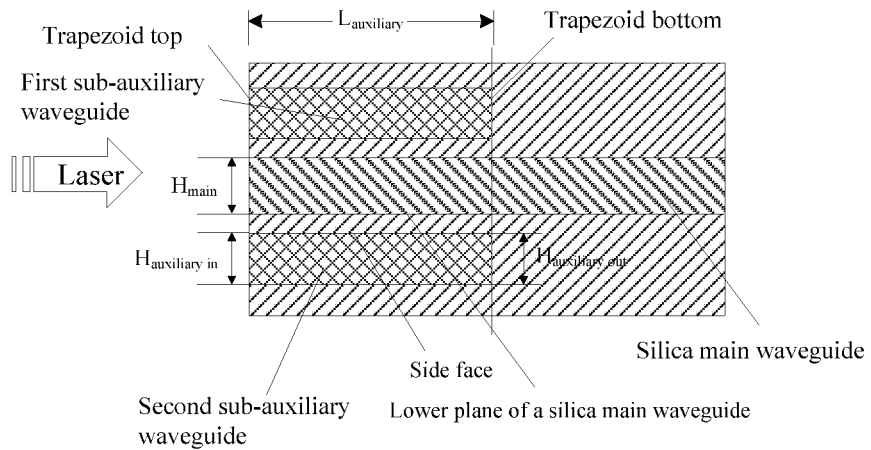
FIG. 33 is a partial enlarged view of a cross-section, taken with reference to a D-D' cross section in FIG. 32, in FIG. 30 according to an embodiment of the present disclosure.
Figure 34:
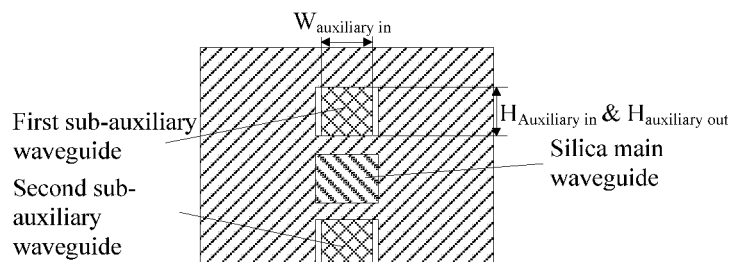
FIG. 34 is a partial enlarged view of a B-B' cross section view in FIG. 30 with reference to FIG. 32 according to an embodiment of the present disclosure.

Based on the multi-core planar optical waveguide structure described in Embodiment 11, Embodiment 12 of the present disclosure specifically describes constitution of an optional silica auxiliary waveguide, as shown in FIG. 32, FIG. 33, and FIG. 34:

The planar optical waveguide internally includes a silica main waveguide for transmitting an optical signal, and an auxiliary waveguide for assisting light entering.

The auxiliary waveguide specifically includes two sub-auxiliary waveguides, where a first sub-auxiliary waveguide is located on an upper side of the silica main waveguide, and a second sub-auxiliary waveguide is located on as lower side of the silica main waveguide; and the silica auxiliary waveguide is disposed at a predetermined center distance from the silica main waveguide.

The center distance is used to ensure that the one or more silica auxiliary waveguides and the silica main waveguide produce a sufficient coupling effect on light receiving surfaces.

With reference to this embodiment of the present disclosure, there is a preferred implementation solution, as shown in FIG. 32 (a top view of an A-A' horizontal cross-section in FIG. 30), and the first sub-auxiliary waveguide and the second sub-auxiliary waveguide each include a regular trapezoidal structure.

A trapezoid top and a light inlet of the silica main waveguide are located on a same side; a trapezoid bottom extends in a direction of light transmission, and a width of the trapezoid bottom is the same as a width of the silica main waveguide.

Side faces of a first sub-auxiliary waveguide trapezoid and a second sub-auxiliary waveguide trapezoid adjacent to upper and lower planes of the silica main waveguide are kept parallel to the upper and lower planes of the silica main waveguide respectively.

In an optional implementation solution, the first sub-auxiliary waveguide and the second sub-auxiliary waveguide each may be of an inverted trapezoidal structure. Compared with the foregoing solution, as shown in FIG. 34, a cross-sectional area of each of the first sub-auxiliary waveguide and the second sub-auxiliary waveguide in the direction of light transmission becomes smaller.

With reference to this embodiment of the present disclosure, when a selected single mode active device has a center wavelength of 1310 nm to 1660 nm and a far-field emission angle of 10° to 40° in the X direction and 10° to 45° in the Y direction, an embodiment of the present disclosure further provides a set of parameters of the main waveguide and the auxiliary waveguide, referring to FIG. 32 and FIG. 33, specifically:

a width $W_{main}$ of the light inlet of the main waveguide=3.0 µm, and a height $H_{main}$=3.0 µm;

a width $W_{auxiliary\ in}$ of a light inlet of the auxiliary waveguide=2.6 µm, and a height $H_{auxiliary\ in}$=3.0 µm;

a width $W_{auxiliary\ out}$ of the trapezoid bottom of the auxiliary waveguide=3.0 µm, and a height $H_{auxiliary\ out}$=3.0 µm;

a length $L_{auxiliary}$ of the auxiliary wavelength=100 µm, and the center distance Δy between the main waveguide and the auxiliary waveguide=3.6 µm.

Figure 35:
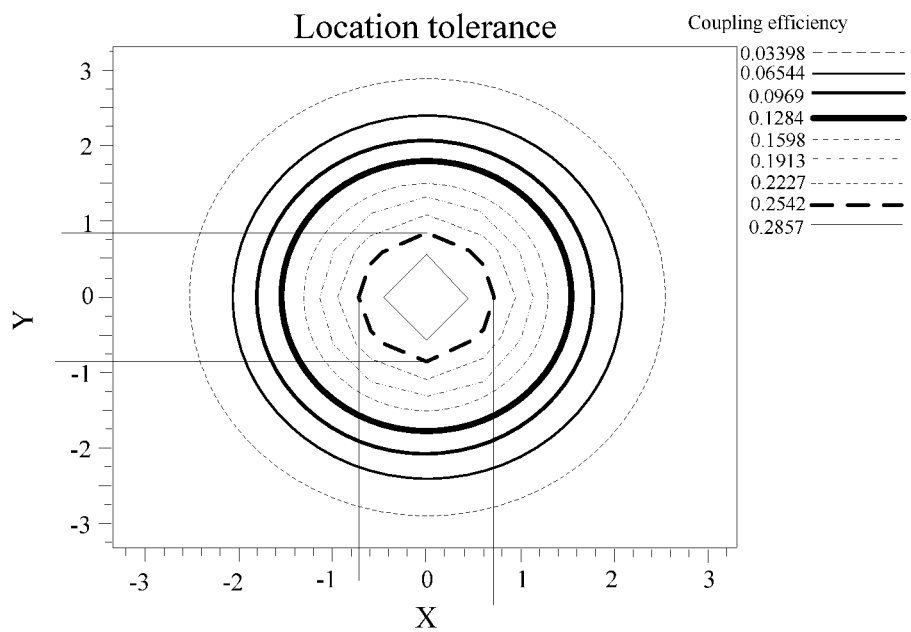
FIG. 35 is a view of location tolerance obtained based on a simulation test according to an embodiment of the present disclosure.

In various implementations of this embodiment, there is an implementation, where the main waveguide and the auxiliary waveguide are in the multi-core planar optical waveguide structure, and the inside and the outside of respective core layers of the main waveguide and the auxiliary waveguide are provided with cladding layers having similar refractive indexes; and a relative refractive index difference is 0.013. All of these dimensions need to be determined through optimization based on application conditions (an operating wavelength, a PLC function, a process condition, and the like). If a front end and a back end have a same size in the prior art, highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs. FIG. 35 is a distribution view coupling efficiency obtained through simulation under such a parameter setting that a single mode active device has a center wavelength of 1310 nm and a far-field emission angle of 25°×40° in the 12 embodiment. The highest coupling efficiency is 32%, and the 6 dB alignment tolerance (as shown in FIG. 35) is:

X direction=+/−0.825 µm;

Y direction=+/−0.9 µm.

Compared with a method of a single waveguide, according to the foregoing result, the highest coupling efficiency is improved, and further, the 6 dB alignment tolerance is extended. At present, precision of a commercial automatic binding machine can reach +/−0.5 According to the result of this embodiment of the present disclosure, the laser can be directly mounted on the PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 13

Figure 36:
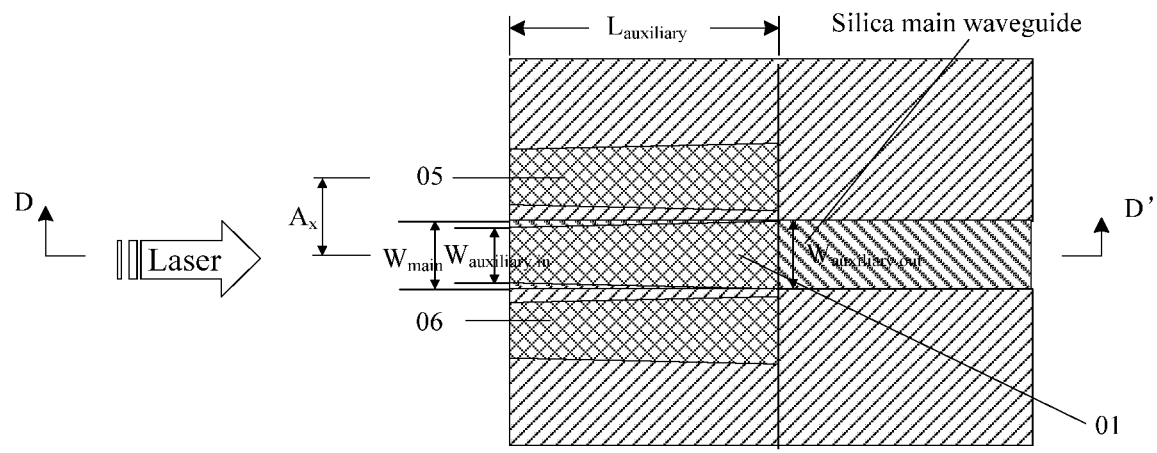
FIG. 36 is another partial enlarged view of a top view of the A-A' cross section in FIG. 30 according to an embodiment of the present disclosure.
Figure 37:
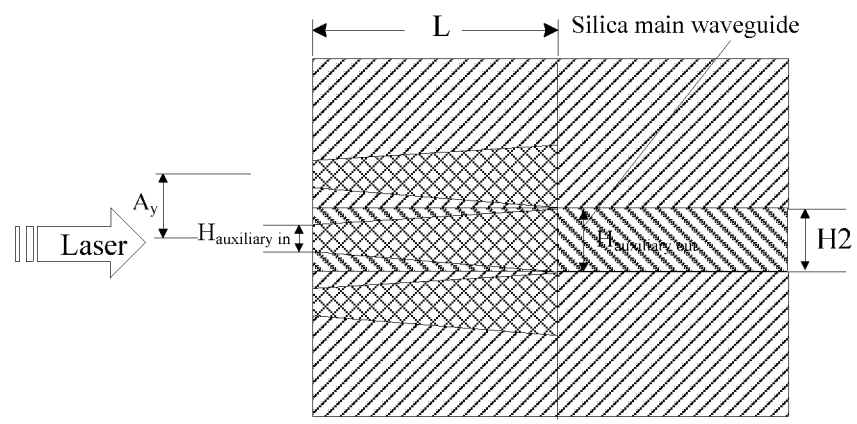
FIG. 37 is a partial enlarged view of a cross-section, taken with reference to a D-D' cross section in FIG. 36, in FIG. 30 according to an embodiment of the present disclosure.
Figure 38:
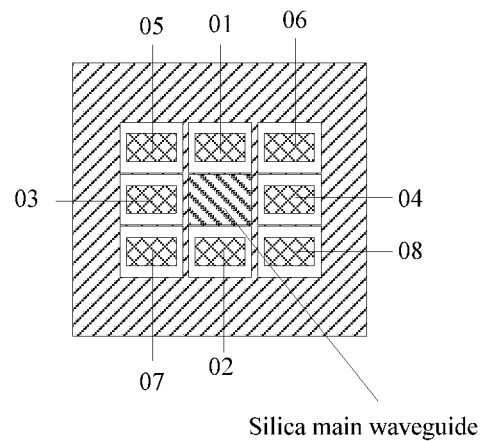
FIG. 38 is a partial enlarged view of a B-B' cross section view in FIG. 30 with reference to FIG. 36 according to an embodiment of the present disclosure.

Based on the multi-core planar optical waveguide structure described in Embodiment 11, Embodiment 13 of the present disclosure specifically describes constitution of an optional silica auxiliary waveguide, as shown in FIG. 36, FIG. 37, and FIG. 38.

The planar optical waveguide internally includes a silica main waveguide for transmitting an optical signal, and an auxiliary waveguide for assisting light entering.

The auxiliary waveguide specifically includes eight sub-auxiliary waveguides, where a first sub-auxiliary waveguide 01 is located on an upper side of the silica main waveguide; a second sub-auxiliary waveguide 02 is located on a lower side of the silica main waveguide; a third sub-auxiliary waveguide 03 is located on a left side of the silica main waveguide; the fourth sub-auxiliary waveguide 04 is located on a right side of the silica main waveguide; a fifth sub-auxiliary waveguide 05 is located on an upper left side of the silica main waveguide, on a left side of the first sub-auxiliary waveguide, and on an upper side of the third sub-auxiliary waveguide; a sixth sub-auxiliary waveguide 06 is located on an upper right side of the silica main waveguide, on the right side of the first sub-auxiliary waveguide, and on an upper side of the fourth sub-auxiliary waveguide; a seventh sub-auxiliary waveguide 07 is located on a lower left side of the silica main waveguide, on a left side of the second sub-auxiliary waveguide, and on a lower side of the third sub-auxiliary waveguide; an eighth sub-auxiliary waveguide 08 is located on a lower right side of the silica main waveguide, on a right side of the second sub-auxiliary waveguide, and on a lower side of the fourth sub-auxiliary waveguide; and the silica auxiliary waveguide is disposed at a predetermined center distance from the silica main waveguide.

The center distance is used to ensure that the one or more silica auxiliary waveguides and the silica main waveguide produce a sufficient coupling effect on light receiving surfaces.

With reference to this embodiment of the present disclosure, there is a preferred implementation solution, as shown in FIG. 36 (a top view of a A-A' horizontal cross-section in FIG. 30). Each sub-auxiliary waveguide is specifically of a regular trapezoidal structure, and four side faces connected with a trapezoid top and a trapezoid bottom are all inclined planes, where the trapezoid top and a light inlet of the silica main waveguide are located on a same side of the multi-core planar optical waveguide.

In an optional implementation solution, silica auxiliary waveguides each may be of an inverted trapezoidal structure. Compared with the foregoing solution, as shown in FIG. 38, a cross-sectional area of each of the first sub-auxiliary waveguide and the second sub-auxiliary waveguide in a direction of light transmission becomes smaller.

In various implementations of this embodiment, there is an implementation, where the main waveguide and the auxiliary waveguide are in the multi-core planar optical waveguide structure, and the inside and the outside of respective core layers of the main waveguide and the auxiliary waveguide are provided with cladding layers having similar refractive indexes; and a relative refractive index difference is 0.013.

With reference to this embodiment of the present disclosure, when a selected single mode active device has a center wavelength of 1310 nm to 1660 nm and a far-field emission angle of 10° to 40° in the X direction and 10° to 45° in the Y direction, an embodiment of the present disclosure further provides a set of parameters of the main waveguide and the auxiliary waveguide, referring to FIG. 36 and FIG. 37, specifically:

a width $W_{main}$ of the light inlet of the main waveguide=3.0 μm, and a height $H_{main}$=3.0 μm;

a width $W_{auxiliary\ in}$ of a light inlet of the auxiliary waveguide=2.5 μm, and a height $H_{auxiliary\ in}$=1.7273 μm;

a width $W_{auxiliary\ out}$ of the trapezoid bottom of the auxiliary waveguide=3.0 μm, and a height $H_{auxiliary\ out}$ is =3.5 μm;

a length $L_{auxiliary}$ of the auxiliary waveguide=100 μm;

the center distance Ax between the main waveguide and the auxiliary waveguide in the X direction=3.5 μm;

the center distance Ay between the main waveguide and the auxiliary waveguide in the Y direction=3.5 μm.

Figure 39:
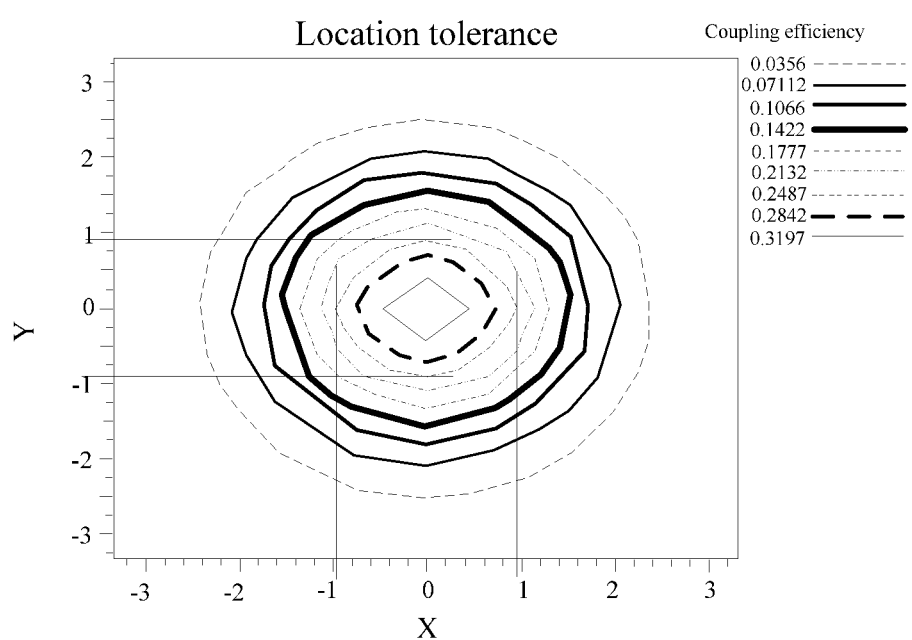
FIG. 39 is a view of location tolerance obtained based on a simulation test according to an embodiment of the present disclosure.

All of these dimensions need to be determined through optimization based on application conditions (an operating wavelength, a PLC function, a process condition, and the like). If a front end and a back end have a same size in the prior art, highest coupling efficiency is only 25%, and there is only one point at which 6 dB alignment tolerance can be achieved. That is, welding fixing between the laser and the PLC needs to reach a very high degree of accuracy, and the 6 dB alignment tolerance cannot be achieved if a slight deviation occurs. FIG. 39 is a distribution view of coupling efficiency obtained through simulation under such a parameter setting that a single mode active device has a center wavelength of 1310 nm and a far-field emission angle of 25°×40° in the 13 embodiment. The highest coupling efficiency is 33%, and the 6 dB alignment tolerance (as shown in FIG. 39) is:

X direction=+/−0.95 μm;

Y direction=+/−0.95 μm.

Compared with a method of a single waveguide, according to the foregoing result, the highest coupling efficiency is improved, and further, the 6 dB alignment tolerance is extended. At present, precision of a commercial automatic binding machine can reach +/−0.5 According to the result of this embodiment of the present disclosure, the laser can be directly mounted on the PLC in an automatic manner, and passive alignment and direct coupling of the laser to the PLC are completed. The application of an automatic device can greatly ensure process quality and shorten alignment and welding time, thereby achieving a purpose of reducing costs.

Embodiment 12 and Embodiment 13 of the present disclosure provide structural layout manners of a linear silica auxiliary waveguide and a square-shaped silica auxiliary waveguides, and a person skilled in the art may design layout manners of a +-shaped silica auxiliary waveguide and a X-shaped silica auxiliary waveguide based on the foregoing preferred solutions, and the layout manners are also within the protection scope of the present disclosure.

Embodiment 14

This embodiment of the present disclosure further provides a multi-core planar optical waveguide coupling structure including a multi-core planar optical waveguide with the structure described in Embodiment 11, 12, or 13. The coupling structure further includes a single mode active device, where the single mode active device includes but is not limited to an FP laser, a DFB laser, an EML, and an SOA. As shown in FIG. 30, the coupling structure is specifically as follows:

The multi-core planar optical waveguide is provided with a single mode active device fixing platform located on a light-incident side of a silica main waveguide and a silica auxiliary waveguide.

A bonding pad and an alignment mark are disposed on the fixing platform, where the bonding pad is configured to be welded to a corresponding bonding pad on the single mode active device; and the alignment mark is configured to provide addressing of a binding welding spot for an automatic binding machine.

As shown in FIG. 30, a bonding pad on the multi-core planar optical waveguide is also referred to as a binding welding spot.

In the coupling structure, a coupling gap d is formed between the single mode active device and light inlets of the silica main waveguide and the silica auxiliary waveguide, and the coupling gap is filled with a matching gel for refractive index matching.

With reference to this embodiment of the present disclosure, the coupling structure including the single mode active device and the multi-core planar optical waveguide specifically includes an EPON optical module, a GPON optical module, high-speed single-channel optical modules SFP and SFP+ in data communication, or parallel modules QSFP and QSFP28 for 40G and 100G optical transmission.

It should be noted that because content of information exchange and execution process and the like of modules and units in the foregoing apparatus and system is based on a same idea as the embodiment of the processing method in the present disclosure, for specific content, reference may be made to the description of the embodiment of the method in the present disclosure, and details are not described herein again.

A person of ordinary skill in the art may understand that all or some steps in various methods of the embodiments can be completed by a program instructing related hardware, and the program may be stored in a computer readable storage medium, and the storage medium may include a read only memory (ROM), a random access memory (RAM), a magnetic disk, an optical disc, or the like.

The foregoing descriptions are merely the preferred embodiments of the present disclosure, and are not intended to limit the present disclosure. Any modifications, equivalent substitutions, and improvements made within the spirit and principles of the present disclosure shall fall within the protection scope of the present disclosure.

What is claimed is:

1. A planar optical waveguide structure, wherein
the planar optical waveguide internally comprises a silica main waveguide for transmitting an optical signal, and an auxiliary waveguide for assisting light entering;
the auxiliary waveguide comprises one or more silica auxiliary waveguides that are positioned at a predetermined center distance from the silica main waveguide;
wherein the auxiliary waveguide specifically comprises eight sub-auxiliary waveguides, wherein a first sub-auxiliary waveguide is located on an upper side of the silica main waveguide; a second sub-auxiliary waveguide is located on a lower side of the silica main waveguide; a third sub-auxiliary waveguide is located on a left side of the silica main waveguide; a fourth sub-auxiliary waveguide is located on a right side of the silica main waveguide; a fifth sub-auxiliary waveguide is located on an upper left side of the silica main waveguide, on a left side of the first sub-auxiliary waveguide, and on an upper side of the third sub-auxiliary waveguide; a sixth sub-auxiliary waveguide is located on an upper right side of the silica main waveguide, on the right side of the first sub-auxiliary waveguide, and on an upper side of the fourth sub-auxiliary waveguide; a seventh sub-auxiliary waveguide is located on a lower left side of the silica main waveguide, on a left side of the second sub-auxiliary waveguide, and on a lower side of the third sub-auxiliary waveguide; and an eighth sub-auxiliary waveguide is located on a lower right side of the silica main waveguide, on a right side of the second sub-auxiliary waveguide, and on a lower side of the fourth sub-auxiliary waveguide.

2. The planar optical waveguide structure according to claim 1, wherein each sub-auxiliary waveguide is specifically of a regular trapezoidal structure, and four side faces connected with a trapezoid top and a trapezoid bottom are all inclined planes, wherein the trapezoid top and a light inlet of the silica main waveguide are located on a same side of a multi-core planar optical waveguide.

* * * * *